(12) United States Patent
Ishida et al.

(10) Patent No.: US 6,975,978 B1
(45) Date of Patent: Dec. 13, 2005

(54) METHOD AND APPARATUS FOR FAULT SIMULATION OF SEMICONDUCTOR INTEGRATED CIRCUIT

(75) Inventors: Masahiro Ishida, Tokyo (JP); Takahiro Yamaguchi, Tokyo (JP); Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 729 days.

(21) Appl. No.: 09/699,077

(22) Filed: Oct. 27, 2000

(30) Foreign Application Priority Data

Jan. 24, 2000 (JP) .............................. 2000-014962

(51) Int. Cl.[7] .......................... G06F 17/50; G01R 31/26
(52) U.S. Cl. ....................... 703/15; 324/765; 324/763; 438/17; 438/18; 716/4; 716/5; 716/6
(58) Field of Search .......................... 703/15; 714/745; 324/765, 763; 438/17, 18; 716/4–6

(56) References Cited

U.S. PATENT DOCUMENTS

| | | | | | |
|---|---|---|---|---|---|
| 5,483,170 | A | * | 1/1996 | Beasley et al. | 324/537 |
| 5,552,744 | A | * | 9/1996 | Burlison et al. | 327/401 |
| 5,726,997 | A | * | 3/1998 | Teene | 324/765 |
| 5,850,404 | A | * | 12/1998 | Sanada | 714/745 |
| 5,949,798 | A | * | 9/1999 | Sakaguchi | 1/1 |
| 5,953,519 | A | * | 9/1999 | Fura | 716/18 |
| 6,031,386 | A | * | 2/2000 | Cole, Jr. et al. | 324/765 |
| 6,140,832 | A | * | 10/2000 | Vu et al. | 324/765 |
| 6,163,763 | A | * | 12/2000 | Cox et al. | 703/17 |
| 6,175,244 | B1 | * | 1/2001 | Gattiker et al. | 324/765 |
| 6,182,258 | B1 | * | 1/2001 | Hollander | 714/739 |
| 6,347,388 | B1 | * | 2/2002 | Hollander | 714/739 |
| 6,461,882 | B2 | * | 10/2002 | Ishida et al. | 438/17 |
| 6,513,137 | B1 | * | 1/2003 | Cortner et al. | 714/736 |
| 6,593,765 | B1 | * | 7/2003 | Ishida et al. | 324/765 |
| 6,801,049 | B2 | * | 10/2004 | Ishida et al. | 324/765 |
| 6,828,815 | B2 | * | 12/2004 | Ishida et al. | 324/765 |

FOREIGN PATENT DOCUMENTS

EP 0878761 11/1998

OTHER PUBLICATIONS

Beasley et al. "Idd Pulse Response Testing : A Unified Approach to Testing Digital and Analogue ICs." Electronics Letters. Nov. 25, 1993. pp. 2101-2103.*
Beasley et al. "Idd Pulse Response Testing on Analog and Digital CMOS Circuits." Proc. Int'l Test Conf, 1993. Oct. 21, 1993. pp. 626-634.*
Jiang, W. and Vinnakota, B. "IC Test Using the Energy Consumption Ratio." Proc. 36th ACM/IEEE DAC. 1999. pp. 976-981.*

(Continued)

*Primary Examiner*—Paul L. Rodriguez
*Assistant Examiner*—Ayal Sharon
(74) *Attorney, Agent, or Firm*—David N. Lathrop, Esq.; Gallagher & Lathrop

(57) ABSTRACT

A test pattern sequence is generated (101), then a logic simulation of the operation of an IC under test in the case of applying each test pattern of the test pattern sequence, and a logic signal value sequence occurring in each signal line of the IC under test (102). The logic signal value sequence in each signal line is used to register in a fault list parts (a logic gate, signal line or signal propagation path) in which a fault (a delay fault or an open fault) detectable by a transient power supply current testing using the test pattern sequence is likely to occur (103).

9 Claims, 21 Drawing Sheets

OTHER PUBLICATIONS

Plusquellic, J.F. et al. "Digital IC Device Testing by Transient Signal Analysis (TSA)." Electronics Letters. Aug. 31, 1995. pp. 1568-1570.*

Plusquellic, J.F. et al. "Digital Integrated Circuit Testing Using Transient Signal Analysis." Proc. Int'l Test Conf, 1996. Oct. 25, 1996. pp. 481-490.*

Segura, J.A. "An Approach to Dynamic Power Consumption Current Testing of CMOS ICs." Proc. 13th IEEE VLSI Test Symposium, 1995. May 3, 1995. pp. 95-100.*

Shyang-Tai, Su et al. "Dynamic Power Supply Current Monitoring of SRAMs." Proc. 7th Annual IEEE Int'l ASIC Conf. and Exhibit, 1994. Sep. 23, 1994. pp. 370-373.*

Jian Liu, et al. "Power Supply Current Detectability of SRAM Defects." Proc. Of 4th Asian Test Symposium. Nov. 24, 1995. pp. 367-373.*

Makki, R. et al. "Transient Power Supply Current Testing of Digital CMOS Circuits." Proc. Int'l Test Conf, 1995. Oct. 25, 1996. pp. 892-901.*

Jian Liu, et al. "Dynamic Power Supply Current Testing of CMOS SRAMs." Proc. 7th Asian Test Symposium, 1998. Dec. 4, 1998. pp. 348-353.*

Agrawal, V. "Contest: A Concurrent Test Generator for Sequential Circuits." Proc. 25th ACM/IEEE DAC, 1988. 1988. pp. 84-89.*

Acuna, E.L. et al. "Simulation Techniques for Mixed Analog / Digital Circuits." IEEE Journal of Solid-State Circuits. vol. 25, Issue 2. pp. 353-363.*

Carmichael, N. et al. "Simulation as an Aid to Power Supply Diagnostics". AUTOTESTCON '95. Aug. 8-10, 1995. pp. 556-560.*

* cited by examiner

FAULT ABSENT : $i_{DDT}(T' + \tau_0) \leq I'$

FAULT PRESENT : $i_{DDT}(T' + \tau_0) > I'$

FIG. 15

| TEST PATTERN SEQUENCE IDENTIFIER | INPUT TERMINAL | | | INTERNAL NODE | | | OUTPUT TERMINAL | | FAULT-DETECTABLE GATE |
|---|---|---|---|---|---|---|---|---|---|
| | I1 | I2 | I3 | N1 | N2 | N3 | O1 | O2 | |
| T1 | 0 | 0 | R | 1 | 1 | 0 | 1 | F | G5 |
| T2 | 0 | 1 | R | 1 | F | R | F | F | G2, G3, G4, G5 |
| T3 | 1 | 0 | R | 0 | 1 | 1 | 0 | 0 | – |
| T4 | 1 | 1 | R | 0 | F | 1 | 0 | 0 | G2 |
| T5 | 0 | R | 0 | 1 | 1 | 0 | 1 | 1 | – |
| T6 | 0 | R | 1 | 1 | F | R | F | 0 | G2, G3, G4 |
| T7 | 1 | R | 0 | 0 | 1 | 1 | 0 | 0 | – |
| T8 | 1 | R | 1 | 0 | F | 1 | 0 | 0 | G2 |
| T9 | R | 0 | 0 | F | 1 | R | F | F | G1, G3, G4, G5 |
| T10 | R | 0 | 1 | F | 1 | R | F | 0 | G1, G3, G4 |
| T11 | R | 1 | 0 | F | 1 | R | F | F | G1, G3, G4, G5 |
| T12 | R | 1 | 1 | F | 0 | 1 | 0 | 0 | G1 |
| ⋮ | ⋮ | ⋮ | ⋮ | ⋮ | ⋮ | ⋮ | ⋮ | ⋮ | ⋮ |

FIG. 17

| TEST PATTERN SEQUENCE IDENTIFIER | INPUT TERMINAL I1 I2 I3 | INTERNAL SIGNAL LINE 1 2 3 4 5 6 7 8 9 10 11 12 | OUTPUT TERMINAL 01 02 | FAULT-DETECTABLE INTERNAL SIGNAL LINE |
|---|---|---|---|---|
| T1  | 0 0 R | 0 0 R R 1 1 1 1 1 1 1 F | 1 F | L3, L5, L12 |
| T2  | 0 1 R | 0 1 R R 1 F F F F F F F | F F | L3, L4, L5, L7, L8, L9, L10, L11, L12 |
| T3  | 1 0 R | 1 0 R R 0 1 0 0 0 0 0 0 | 0 0 | – |
| T4  | 1 1 R | 1 1 R R 0 F 0 0 0 0 0 0 | 0 0 | L3, L4 |
| T5  | 0 R 0 | 0 R 0 0 0 1 1 1 1 1 1 1 | 1 1 | – |
| T6  | 0 R 1 | 0 R 1 1 1 1 F F F F F 0 | F 0 | L2, L7, L8, L9, L11 |
| T7  | 1 R 0 | 1 R 0 0 0 0 1 0 0 0 0 0 | 0 0 | – |
| T8  | 1 R 1 | 1 R 1 1 1 0 F 0 0 0 0 0 | 0 0 | L2 |
| T9  | R 0 0 | R 0 0 0 0 F 1 F F F F F | F F | L1, L6, L8, L9, L10, L11, L12 |
| T10 | R 0 1 | R 0 1 1 1 F 1 F F F F 0 | F 0 | L1, L6, L8, L9, L11 |
| T11 | R 1 0 | R 1 0 0 0 F 1 F F F F F | F F | L1, L6, L8, L9, L10, L11, L12 |
| T12 | R 1 1 | R 1 1 1 1 F 0 0 0 0 0 0 | 0 0 | L1 |
| ⋮ | ⋮ | ⋮ | ⋮ | ⋮ |

FIG. 24

| TEST PATTERN SEQUENCE IDENTIFIER | INPUT TERMINAL | | | INTERNAL NODE | | | OUTPUT TERMINAL | | FAULT-DETECTABLE PATH |
|---|---|---|---|---|---|---|---|---|---|
| | I1 | I2 | I3 | N1 | N2 | N3 | O1 | O2 | |
| T1 | 0 | 0 | R | 1 | 1 | 0 | 1 | F | <I3, O2> |
| T2 | 0 | 1 | R | 1 | F | R | F | F | <I3, N2, N3, O1>, <I3, N2, N3, O2> |
| T3 | 1 | 0 | R | 0 | 1 | 1 | 0 | 0 | − |
| T4 | 0 | 1 | R | 0 | F | 1 | 0 | 0 | − |
| T5 | 0 | R | 0 | 1 | 1 | 0 | 1 | 1 | − |
| T6 | 0 | R | 1 | 1 | F | R | F | 0 | <I2, N2, N3, O1> |
| T7 | 1 | R | 0 | 0 | 1 | 1 | 0 | 0 | − |
| T8 | 1 | R | 1 | 0 | F | 1 | 0 | 0 | − |
| T9 | R | 0 | 0 | F | 1 | R | F | F | <I1, N1, N3, O1>, <I1, N1, N3, O2> |
| T10 | R | 0 | 1 | F | 1 | R | F | 0 | <I1, N1, N3, O1> |
| T11 | R | 1 | 0 | F | 1 | R | F | F | <I1, N1, N3, O1>, <I1, N1, N3, O2> |
| T12 | R | 1 | 1 | F | 0 | 1 | 0 | 0 | − |
| ⋮ | ⋮ | ⋮ | ⋮ | ⋮ | ⋮ | ⋮ | ⋮ | ⋮ | ⋮ |

FIG. 25

| TEST PATTERN SEQUENCE IDENTIFIER | INPUT TERMINAL 1 2 3 | INTERNAL SIGNAL LINE 1 2 3 4 5 6 7 8 9 10 11 12 | OUTPUT TERMINAL 1 2 | FAULT-DETECTABLE PATH |
|---|---|---|---|---|
| T1 | 0 0 R | 0 0 R R R 1 1 1 1 1 1 F | 1 F | <I3, L3, L5, L12, O2> |
| T2 | 0 1 R | 0 1 R R R 1 F F F F F F | F F | <I3, L3, L5, L12, O2><br><I3, L3, L4, L7, L8, L9, L11, O1><br><I3, L3, L4, L7, L8, L10, L12, O1> |
| T3 | 1 0 R | 1 0 R R R 0 1 0 0 0 0 0 | 0 0 | – |
| T4 | 1 1 R | 1 1 R R R 0 F 0 0 0 0 0 | 0 0 | – |
| T5 | 0 R 0 | 0 R 0 0 0 1 1 1 1 1 1 1 | 1 1 | – |
| T6 | 0 R 1 | 0 R 1 1 1 1 F F F F F 0 | F 0 | <I2, L2, L7, L8, L9, L11, O1> |
| T7 | 1 R 0 | 1 R 0 0 0 0 1 0 0 0 0 0 | 0 0 | – |
| T8 | 1 R 1 | 1 R 1 1 1 0 F 0 0 0 0 0 | 0 0 | – |
| T9 | R 0 0 | R 0 0 0 0 F 1 F F F F F | F F | <I1, L1, L6, L8, L9, L11, O1><br><I1, L1, L6, L8, L10, L12, O2> |
| T10 | R 0 1 | R 0 1 1 1 F 1 F F F F 0 | F 0 | <I1, L1, L6, L8, L9, L11, O1> |
| T11 | R 1 0 | R 1 0 0 0 F 1 F F F F F | F F | <I1, L1, L6, L8, L9, L11, O1><br><I1, L1, L6, L8, L10, L12, O2> |
| T12 | R 1 1 | R 1 1 1 1 F 0 0 0 0 0 0 | 0 0 | – |
| ⋮ | ⋮ ⋮ ⋮ | ⋮ ⋮ ⋮ ⋮ ⋮ ⋮ ⋮ ⋮ ⋮ ⋮ ⋮ ⋮ | ⋮ ⋮ | ⋮ |

METHOD AND APPARATUS FOR FAULT SIMULATION OF SEMICONDUCTOR INTEGRATED CIRCUIT

BACKGROUND OF THE INVENTION

The present invention relates to a fault simulation method and apparatus which make a list of faults in a semiconductor integrated circuit that are detectable using a certain test pattern sequence.

In a conventional fault simulation of a semiconductor integrated circuit (hereinafter referred to as a semiconductor IC or simply as an IC), predetermined test patterns are input to the semiconductor IC with faults assumed to lie therein, then response output values available from its output terminal are calculated by a logic simulation to detect variations in the output values relative to those obtainable under fault-free conditions, and the results thus obtained are summarized as a comparative table of assumed faults and input/output logic values, which table is commonly called a fault dictionary. This is a conventional way of making a list of faults detectable by the test patterns. In the testing of an IC each test pattern is input thereto, and its response output value and the input value are used to refer to the fault dictionary to decide whether the IC is under faulty conditions and, if any, locate which part or parts of the IC are faulty.

Further, to cope with faults that do not cause logic faults, such as a bridging fault and a current leak fault, there has been proposed a fault simulation method that uses, in combination, an IDDQ (quiescent power supply current) testing scheme and a logic simulation. According to this method, the logic simulation is used to calculate logic signal values that develop on signal lines in the IC in response to a certain test pattern applied thereto, and a list of detectable fault is made by enumerating faults which satisfy the criteria for the occurrence of IDDQ abnormalities with the faults assumed to lie in the IC. Upon application of a certain test pattern to an IC, each signal line usually has a logic value "0" or "1." On this account, when a bridging fault occurs between the signal lines having the logic values "0" and "1," respectively, the IC develops an IDDQ abnormality. Accordingly, bridging faults between all signal lines of the logic values "0" and "1" in the IC are detectable based on input test patterns by the IDDQ testing scheme, and these bridging faults can be complied into a list of faults detectable by the IDDQ testing scheme.

According to the fault simulation method using the logic simulation, however, the fault model that can be simulated is limited only to a single stuck-at-fault (Stuck-At-0 or Stuck-At-1) which is a fault that one signal line is stuck at a certain state ("0"or "1"). Therefore, it is impossible with this fault simulation method to simulate, with high sensitivity, a multiple stuck-at-fault that plural signal lines are stuck at "0" or "1", a delay fault, a short fault between lines, and so on; hence, no lists of detectable faults can be made.

Further, the fault simulation method by the combined use of the IDDQ testing scheme and the logic simulation is a method of measuring the power supply current of the semiconductor IC under stable conditions, and is intended primarily for short faults in the circuit. Hence, this method is incapable of making lists of detectable faults on transient phenomena of semiconductor ICs such as delay fault and open faults affecting the delay time and abnormalities of local or global process parameters (a sheet resistance, an oxide film thickness, and so forth).

Accordingly, there is a need for the implementation of a fault simulation method with which it is possible to make a list of faults detectable using a certain test pattern sequence for the above-mentioned delay faults, open faults and parameter abnormality faults.

An object of the present invention is to provide a fault simulation method and apparatus with which it is possible to make a list of faults detectable by a certain test pattern sequence for delay, open and parameter abnormality faults in semiconductor ICs by the combined use of a transient power supply current, IDDQ testing scheme capable of transient phenomenon of the ICs and high in observability and the logic simulation.

SUMMARY OF THE INVENTION

According to an aspect of the present invention, there is provided a fault simulation method for making a list of faults detectable using an input test pattern sequence, which comprises the steps of: generating a test pattern sequence composed of two or more test patterns for input to a semiconductor IC under test; performing a logic simulation to detect what situation will develop in the IC under test upon application thereto of each test pattern and calculating a logic signal value sequence produced in signal lines of the IC under test; and making a list of faults detectable with the transient power supply current testing through the use of the logic signal value sequence of the signal lines calculated by the logic simulation.

With this method, it is possible to make a list of faults detectable by the transient power supply current testing using a certain test pattern sequence for conventionally undetectable delay faults or open faults leading to the delay faults—this significantly improves the efficiency of testing for such delay and open faults.

One form of the fault-list-making step in the above is to make a list of faults that develop in logic gates.

Another form of the fault-list-making step in the above is to make a list of faults that develop in signal lines.

Still another form of the fault-list-making step in the above is to make a list of faults that develop in signal propagation paths.

According to another aspect of the present invention, there is provided a fault simulator for making a list of faults detectable using an input test pattern sequence, which comprises: test pattern generating means for generating a test pattern sequence composed of two or more test patterns for the application to a semiconductor IC under test; a logic simulator which performs a logic simulation to detect what situation will develop in the IC under test upon input thereto each test pattern of the pattern sequence and calculates a logic signal value sequence that would be produced in signal lines of the IC under test; and fault list making means for making a list of faults detectable by a transient power supply current testing through the use of the logic signal value sequence calculated by the logic simulator.

With the fault simulator of the above construction, it is possible to make a list of faults detectable by the transient power supply current testing using a certain test pattern sequence for conventionally undetectable delay faults or open faults leading to the delay faults—this significantly improves the efficiency of testing for such delay and open faults.

According to another aspect of the present invention, there is provided a method for making a list of faults detectable using an input test pattern sequence, which comprises the steps of: inserting an assumed fault into a semiconductor IC under test; generating a test pattern sequence composed of two or more test patterns for input to the IC under test; calculating a transient power supply current of the IC under test by performing a circuit simulation in the case of applying the test pattern sequence to the IC with the assumed fault inserted therein; comparing the transient power supply current calculated by the circuit simulation with a transient power supply current of a normal IC and deciding whether the fault is detectable by a transient power supply current testing using the test pattern sequence.

With this method, it is possible to make a list of faults detectable by the transient power supply current testing using a certain test pattern sequence for delay, open and parameter abnormality faults which have been impossible to detect. Hence, this method significantly improves the efficiency of testing for such delay and open faults.

According to still another aspect of the present invention, there is provided a fault simulator for making a list of faults detectable using an input test pattern sequence, which comprises: test pattern sequence generating means for generating a test pattern sequence composed of two or more test patterns for input to the IC under test; means for inserting an assumed fault into the IC; a circuit simulator for calculating a transient power supply current of the IC by performing a circuit simulation in the case of applying the test pattern sequence to the IC with the assumed fault inserted therein; fault-list-making means for making a fault list by comparing the transient power supply current calculated by the circuit simulation with a transient power supply current of a normal IC and deciding whether the fault is detectable by a transient power supply current testing using the test pattern sequence.

With this fault simulator, it is possible to make a list of faults detectable by the transient power supply current testing using a certain test pattern sequence for delay, open and parameter abnormality faults which have been impossible to detect. Hence, this fault simulator significantly improves the efficiency of testing for such delay and open faults.

Principle of the Invention

To facilitate a better understanding of the present invention, the principle of the present invention will be described below with reference to a CMOS IC that is a typical example of a semiconductor IC.

The power supply current of the CMOS IC is a current flowing into the CMOS IC, is expressed by the sum of currents through respective logic gates in the IC.

Transient Power Supply Current

FIG. 1 depicts a transient response of a CMOS inverter. This transient response was obtained with a circuit simulator. As shown in FIG. 1C, the CMOS inverter is formed by a series connection of p- and n-MOS transistors, which is connected at both ends to a power supply terminal $T_{VD}$ and the ground GND. The both transistors have their gates connected to an output terminal IN, and their connection point is connected to an output terminal OUT. FIG. 1A depicts a response of an output voltage $V_{OUT}$ to an input voltage $V_{IN}$ in a transient state, and FIG. 1B depicts a response of a current $I_{DD}$ flowing into the CMOS inverter from the power supply at that time. The current flowing into the CMOS inverter is called a transient current. When the input to the inverter changes from a logic value "1" to "0" as shown in FIG. 1C, the n- and p-MOS transistors simultaneously turn ON for a very short period of time when the input voltage $V_{IN}$ is higher than a threshold voltage of the n-MOS transistor but lower than a threshold voltage of the p-MOS transistor, and a short circuit current $I_S$ flows from the power supply terminal $T_{VD}$ to the ground GND. Since at this time the potential at the output terminal OUT changes from the logic value "0" to "1," a current $I_C$ for charging a parasitic capacitance $C_{load}$ connected to an output signal line (the terminal OUT) of the inverter flows from the power supply terminal $T_{VD}$ at the same time as the short circuit current $I_S$ flows. Accordingly, when the input to the inverter makes a falling transition (described by a suffix "f" to a parameter indicating this state), the transient current $I_{Gf}$ flowing into the inverter is given by the sum of the short circuit current $I_{Sf}$ and the capacitance charging current) $I_C$ as follows:

$$I_{Gf}=I_{Sf}+I_C. \quad (1)$$

On the other hand, when the inverter input changes from "0" to "1" as shown in FIG. 1D, the inverter output changes from "1" to "0" (described by a suffix "r" to a parameter indicating this state), triggering a discharge from the parasitic capacitance $C_{load}$ connected to the output terminal OUT, and hence generating a capacitance discharging current $I_D$. In this case, however, the current $I_{Gr}$ from the power supply terminal $T_{VD}$ to the inverter is only the short circuit current $I_{Sr}$. Consequently, the peak of the transient current $I_{Gr}$ is a little smaller than $I_{Gf}$.

$$I_{Gr}=I_{Sr} \quad (2)$$

The transfer characteristic of the CMOS inverter provides a triangular-pulse-like short circuit current $I_S$ with a change in the input voltage $V_{IN}$ as depicted in FIG. 2A. On this account, when the input to the CMOS inverter makes a rising transition, the short circuit current $I_{Sr}$ through the CMOS inverter can be approximated by a triangular pulse indicated by "$I_S$" in FIG. 2B on the assumption that the input voltage $V_{IN}$ makes a ramp-like transition as shown in FIGS. 2A and 2B. Further, the short circuit current $I_{Sr}$ of the CMOS inverter caused by the rising transition of the input voltage $V_{IN}$ shown in FIG. 2B is given by the following expression.

$$\begin{aligned}
I_{Sr} &= 0 \text{ for } t \leq \frac{V_{THN}}{V_{DD}}t_r \\
&= \frac{V_{DD} \cdot I_{Smax}}{(V_{SP}-V_{THN}) \cdot t_r}t - \frac{V_{THN} \cdot I_{Smax}}{(V_{SP}-V_{THN})} \text{ for } \frac{V_{THN}}{V_{DD}}t_r < t \leq \frac{V_{SP}}{V_{DD}}t_r \\
&= \frac{V_{DD} \cdot I_{Smax}}{(V_{SP}-V_{DD}+V_{THP}) \cdot t_r}t - \frac{(V_{DD}-V_{THP}) \cdot I_{Smax}}{(V_{SP}-V_{DD}+V_{THP})} \text{ for } \frac{V_{SP}}{V_{DD}}t_r < t \leq \frac{V_{DD}-V_{THP}}{V_{DD}}t_r \\
&= 0 \text{ for } t \geq \frac{V_{DD}-V_{THP}}{V_{DD}}t_r
\end{aligned} \quad (3)$$

where $I_{Smax}$ is the maximum value of the transient current (short circuit current) $I_S$ flowing into the CMOS inverter, $V_{DD}$ is the power supply voltage at the power supply terminal $T_{VD}$, $V_{THN}$ is a threshold voltage of the n-MOS transistor, $V_{THP}$ is a threshold voltage of the p-MOS transistor and $t_r$ is the rising transition time of the input voltage $V_{IN}$. Note that the threshold voltage $V_{THP}$ is shown in absolute value. Further, to simplify the approximate expression, the input voltage $V_{IN}$ is shown to start the transition at time 0 and the input voltage $V_{IN}$ is shown to reach $V_{DD}$ at the transition end time $t_r$.

The short circuit current $I_{Sf}$ of the CMOS inverter caused by the falling transition of the input voltage $V_{IN}$ can similarly be obtained as follows:

$$\begin{aligned}
I_{Sf} &= 0 \text{ for } t \leq \frac{V_{THP}}{V_{DD}} t_f \\
&= \frac{V_{DD} \cdot I_{Smax}}{(V_{DD} - V_{THP} - V_{SP}) \cdot t_f} t - \frac{V_{THP} \cdot I_{Smax}}{(V_{DD} - V_{THP} - V_{SP})} \text{ for } \frac{V_{THP}}{V_{DD}} t_f < t \leq \frac{V_{DD} - V_{SP}}{V_{DD}} t_f \\
&= \frac{V_{DD} \cdot I_{Smax}}{(V_{THN} - V_{SP}) \cdot t_f} t - \frac{(V_{DD} - V_{THN}) \cdot I_{Smax}}{(V_{THN} - V_{SP})} \text{ for } \frac{V_{DD} - V_{SP}}{V_{DD}} t_f < t \leq \frac{V_{DD} - V_{THN}}{V_{DD}} t_f \\
&= 0 \text{ for } t \geq \frac{V_{DD} - V_{THN}}{V_{DD}} t_f
\end{aligned} \quad (4)$$

where $t_f$ is the falling transition time of the input voltage $V_{IN}$. For precaution's sake, the rise start time of the power supply current, the time of its maximum value $I_{Smax}$ and its fall end time are shown in parentheses in FIG. 2B.

Moreover, the capacitance charging current $I_C$ to the parasitic capacitance $C_{load}$ at the output terminal (signal line) OUT of the CMOS inverter is given by the following equation in which $v_{out}(t)$ is a voltage change in the output signal line OUT.

$$I_C = C_{load} \frac{dv_{out}(t)}{dt} \quad (5)$$

These equations can similarly be obtained for a logic gate as well as for the inverter.

Provided that a transient current $I_G$ flowing into the logic gate is almost a short circuit current, it can be approximated by such a triangular pulse as indicated by $I_S$ in FIG. 2B. In actuality, the waveform of the transient current $I_G$ of the CMOS inverter is such a triangular pulse waveform as depicted in FIG. 1B. Accordingly, the transient current $I_G$ of the logic gate monotonously increases up to the maximum value $I_{Smax}$ and then monotonously decreases. Further, the transient current $I_G$ reaches the maximum value $I_{Smax}$ at the same time as the input voltage $V_{IN}$ reaches a switching voltage $V_{SP}$ of the logic gate. That is, as shown in FIG. 2B, the transient current $I_G$ peaks out simultaneously with an input transition of the logic gate. Since the logic gate has a delay time, the output transition of the logic gate slightly lags behind its input transition. In other words, the transient current $I_G$ peaks out slightly prior to the output transition of the logic gate. In this instance, it can be considered that the falling edge (falling portion) of the waveform of the transient current $I_G$ coincides with the time of output transition. Further, the pulse width of the waveform of the transient current $I_G$ of the logic gate is in proportion to the transition time (for example, the rising transition time $t_r$) of the input voltage $V_{IN}$.

The foregoing description has been given on the assumption that the transient current $I_G$ flowing into the logic gate is mostly the short circuit current $I_S$. With the recent microfabrication of CMOS circuits, wiring delay becomes dominant over the gate delay. This implies that, assuming that the transition time of the input voltage is fixed, the ratio of the charging current $I_C$ to the output signal line OUT is higher than the ratio of the short circuit current $I_S$ in the transient current $I_G$ that flows into the CMOS logic gate. Hence, the time when the waveform of the transient current $I_G$ of the logic gate reaches its peak is dependent on the ratio between the capacitance charging current $I_C$ and the short circuit current $I_S$. When the capacitance charging current $I_C$ is smaller than the short circuit current $I_S$, the peak of the waveform of the transient current $I_G$ coincides with the peak of the short circuit current $I_S$. Since the peak of the short circuit current $I_S$ coincides with the time of transition of the input voltage, the peak of the transient current $I_G$ precedes the transition time of the logic gate output. Conversely, when the capacitance charging current $I_C$ is larger than the short circuit current $I_S$, the peak of the waveform of the transient current $I_G$ concurs with the peak of the current $I_C$. Since the capacitance charging current $I_C$ is related to the voltage transition on the output signal line OUT, the peak of the transient current $I_G$ virtually coincides with the transition time of the output from the logic gate.

FIG. 3A depicts a CMOS IC, which is formed by a series connection of four inverters G1, G2, G3 and G4 and in which transient currents $I_{G1}$, $I_{G2}$, $I_{G3}$ and $I_{G4}$ flowing across them are usually fed from one power supply terminal $T_{VD}$. Accordingly, when the input voltage $V_{IN1}$ to the inverter G1 varies as shown in FIG. 3B, a transient power supply current response of the illustrated IC is expressed as the sum of transient currents $I_{G1}$ to $I_{G4}$ flowing across the logic gates G1 to G4, and is given by the following equation.

$$I_{DDT} = \sum_{n=1}^{N} I_{Gn} \quad (6)$$

where N is the number of logic gates that are switched by an input test pattern sequence; N=4 in the example of FIG. 3A.

Since the peak (or trailing edge) of the transient current waveform of the logic gate corresponds to the transition time of the output from the logic gate, the final peak (the final trailing edge) of the transient current waveform of the CMOS IC coincides with the time of transition of the output from the logic gate G4 that is switched last in the CMOS IC. Accordingly, the path delay time of the CMOS IC can be calculated by detecting the final peak (the final trailing edge) of the transient power supply current waveform of the CMOS IC and comparing the time of the detected final peak and the time of a input transition. In this case, the time of the final trailing edge of the transient power supply current can be calculated, for example, as the maximum value of the time when the transient power supply current reaches a predetermined value. In general, the above-mentioned predetermined current value of the transient power supply current is the value that the power supply current reaches at the time when the output from the last logic gate on that one of plural logic signal path in the semiconductor IC which is under test reaches a value one half that of the power supply voltage. This predetermined current value is available, for instance, from statistic data obtained by performing a circuit simulation of the circuit under test or by using a real device.

In the manner described above, the delay time of each path in the semiconductor IC can be calculated, and by comparing the thus obtained delay time with a predetermined time (for example, the period $T_{CLK}$ of a system clock), a delay fault in the path under test can be detected.

Delay Fault

In the first place, a definition will be given of the delay fault. Consider the activation of one signal propagation path $P=\{g_0, g_1, g_2, \ldots, g_m\}$ in a CMOS logic circuit through the use of a test pattern sequence $T=<v_1, v_2>$ (indicating that a voltage signal $v_1$ is followed by a voltage signal $v_2$) which is composed of two test patterns $v_1$ and $v_2$. In the above, $g_0$ is an input signal line of the path P, and $g_1, g_2, \ldots, g_m$ are output signal lines of logic gates $G_1, G_2, \ldots, G_m$ on the path P, while at the same time $g_0, g_1, \ldots, g_{m-1}$ are input signal lines of the logic gates $G_1, G_2, \ldots, G_m$ on the path P as well. Letting the time of signal transition in the signal lines $g_0$, $g_1, \ldots, g_m$ (the times when a voltage signal crosses $V_{DD}/2$) be represented by $\tau_0, \tau_1, \ldots, \tau_m$, respectively, the gate delay time $t_{gdi}$ (where $1 \leq i \leq m$) of each of the logic gate $G_1$, $G_2, \ldots, G_m$ on the path P is given by $$t_{gdi} = \tau_i - \tau_{i-1} \quad (7)$$

Accordingly, the path delay time $t_{pd}$ of the path P can be calculated, as the sum of gate delay times $t_{gdi}$, by $$t_{pd} = \sum_{i=1}^{ni} t_{gdi} = \tau_{ni} - \tau_0 \quad (8)$$

However, the actual gate delay time $t_{gdi}$ varies under the influence of a fault.

$$t_{gdi} = t_{gdi,typ} + \delta_i, 1 \leq i \leq m \quad (9)$$

where $t_{gdj,typ}$ is a typical value of the delay time of the logic gate G1 and $\delta_i$ is a variation component of the gate delay time. For example, an open fault increases the delay time of a faulty logic gate alone but does not increase the delay time of a fault-free or normal logic gate. And a parameter abnormality fault increases the delay time of every logic gate. With a change in the gate delay time, the path delay time $t_{pd}$ also undergoes a similar change, which can be expressed by the following equation.

$$t_{pd} = t_{pd,typ} + \Delta = \sum_{i=1}^{ni} (t_{gdi,typ} + \delta_i) \quad (10)$$

where $t_{pd,typ}$ is a typical value of the delay time of the path P and $\Delta$ is a variation component of the path delay time.

FIG. 4 schematically shows the basic principle of a delay fault testing method. As depicted in FIG. 4A, the test pattern sequence $<v_1, v_2>$ is latched in an input latch on a pattern-wise basis for each system clock CLK, from which it is applied to the input signal of each path of the semiconductor IC under test, and the output from each output signal line of the IC under test is latched by the clock CLK. In order for the IC under test to operate normally, it is necessary that a signal transition made in the input latch be propagated to the output latch via the path P in the IC under test within a predetermined time. Accordingly, based on the relationship between the input $V_{IN}$ and output $V_{OUT}$ of the path P shown in FIG. 4B and the system clock CLK shown in FIG. 4C, the delay time $t_{pd}$ of the path P needs to satisfy the following condition.

$$t_{pd} + T_{SU} < T_{CLK} - T_{SKW} \quad (11)$$

where $T_{SU}$ is a signal set-up time, $T_{CKL}$ is the period of the system clock CLK and $T_{SKW}$ is a clock skew of the system clock CKL (the amount of ± variations of the edge of the clock CLK due to its jitter). Modifying Eq. (11) gives $$t_{pd} < T_{CLK} - T_{SKW} - T_{SU} = T' \quad (12)$$

That is, the delay time $t_{pd}$ of the path P needs to be shorter than the time (T') obtained by subtracting from the clock period $T_{CLK}$ such margins as the set-up time $T_{SU}$ and the clock skew $T_{SKW}$. If $t_{pd}$ is larger than T', then the signal propagation over the path P lags behind the system clock at which to latch it in the output latch; so that the circuit does not operate normally. This state is defined as the delay fault. That is, it is defined that the path P has a delay fault when the delay time $t_{pd}$ is longer than the predetermined time T', where T' is the permissible upper limit value of the delay time.

Open Fault (Accompanied by Delay Fault)

Next, a definition is given of an open fault that leads to the delay fault. The open fault is an unintentional electrical discontinuity, which divides a certain signal line into two or more different signal lines. Included in the open faults are faults such as a break in a contact due to loss of metal or by an oxide film, a break in a metal wire due to patterning failure or etching failure and a break in a diffusion layer or poly-Si layer due to masking failure. Such open faults fill into two types: an open fault which causes a "logic fault" that the input signal $V_{IN}$ does not ever appear at the output $V_{OUT}$ of a signal line $W_i$ due to an open $F_C$ in the signal line $W_i$ as shown in FIG. 5A, and an open fault which causes a "delay fault" that the input signal $V_{IN}$ passes through the breakage or the portion of the open $F_C$ by, for example, a tunneling current and appears at the output $V_{OUT}$ of the signal line $W_i$ after a time lag as depicted in FIG. 5B. The open fault which causes the logic fault is so large in the scale of open that no current flows even if a voltage is applied to the broken signal line $W_i$ across the breakage. Consequently, the parasitic capacitance is not charged and discharged in association with the signal transition, resulting in the logic fault that logic is kept at a certain value. In contrast thereto, in the open fault which leads to the delay fault, when a voltage is applied to the signal line $W_i$ across the breakage, a very small current is generated; however, since the amount of such current is smaller than the current flow during normal operation, the charge and discharge of the parasitic capacitance associated with the signal transition are delayed, resulting in an increase in the delay time of the circuit. The open faults of this kind are classified into a resistive open fault that the resistance value between signal lines becomes larger than its normal value due to a contact failure or the like or the resistance value of a signal line becomes larger than its normal value due to a failure in the signal line, and a small open fault (<100 nm) that the tunneling effect generates a very small leak current flow across the breakage. The tunnel currant that flows across the small open fault is described, for example, in C. L. Henderson, J. M. Soden, and C. F. Hawkins, "The Behavior and Testing Implications of CMOS IC Logic Gate Open Circuits," Proceedings of IEEE International Test Conference, pp. 302–310, 1991. The present invention is intended for the open fault that causes the delay fault. In this specification the fault of this kind will hereinafter be referred to merely as an open fault.

Delay Fault Detecting Method (Using the Pulse Width of the Transient Power Supply Current)

Next, a description will be given of a method for detecting the delay fault through utilization of the pulse width of the above-mentioned transient power supply current. This method is one that measures the pulse width of the power supply current of the circuit under test and compares it with a predetermined time. FIG. 6 shows the basic principle of this method.

Assumed that in a CMOS logic circuit, plural paths $P_1$, $P_2$, ..., $P_n$ are activated by a test pattern sequence $T=<v_1, v_2>$ which has two test patterns $v_1$ and $v_2$. Letting $\tau_{ij}$ represent the switching time of the j-th logic gate from the input of the path $P_i$, the number of logic gates differs with the paths $P_1$, ..., $P_n$, and the output transition time $\tau_{max}$ of the logic gate $G_{final}$ which is switched last among the logic gates on he paths $P_1$, ..., $P_n$ is given by $$\tau_{max} = \max_{i,j}\{\tau_{ij}\}, 1 \le i \le n, 1 \le j \quad \cdot 13)$$

Accordingly, The maximum value $t_{pd,max}$ of the path delay time in the paths $P_1$, ..., $P_n$ can be calculated as the time interval between the time $\tau_{max}$ and the input transition time $\tau_0$ by $$t_{pd,max}=\tau_{max}-\tau_0 \quad (14)$$

On the other hand, the pulse width $t_{PW}$ of the transient power supply current waveform of the CMOS logic circuit is defined to be the time interval between the input transition time $\tau_0$ and the time $\tau_{IDD}$ of the last peak (trailing edge) of the transient power supply current waveform.

$$t_{PW}=\tau_{IDD}-\tau_0 \quad (15)$$

As described previously, the time $\tau_{IDD}$ of the last peak of the transient power supply current waveform precedes the output transition time $\tau_{max}$ of the logic gate $G_{final}$ that performs switching last, and the trailing edge of the transient power supply current waveform coincides with the output transition time $\tau_{max}$ of the logic gate $G_{final}$. Accordingly, the pulse width $t_{PW}$ of the transient power supply current corresponds to the delay time $t_{pd,max}$ of the path P that is activate by the test pattern T.

$$t_{PW}=\tau_{IDD}-\tau_0 \le \tau_{max}-\tau_0=t_{pd,max} \quad (16)$$

If the pulse width $t_{PW}$ is larger than the permissible upper limit value T' of the delay time, $$T'<t_{PW} \le t_{pd,max} \quad (17)$$

In the path of the largest delay time $t_{pd,max}$, the signal propagation lags behind the system clock. That is, the delay fault is present in the circuit. Hence, $t_{PW}$ larger than T' indicates the presence of the delay fault in any one of the activated paths, whereas $t_{PW}$ smaller than T' indicates the absence of the delay fault in any of the activated paths.

Delay fault absent: $t_{PW} \le T'$

Delay fault present: $t_{PW}>T'$ \quad (18)

This relationship is depicted in FIG. 6. FIG. 6A depicts the input and output voltages $V_{IN}$ and $V_{OUT}$ of a path in the cases where the path is faulty and fault-free. FIG. 6B similarly shows the transient power supply current in the cases where the path is faulty and fault-free.

As described above, the circuit can be tested for the delay fault by comparing the pulse width $t_{PW}$ of the transient power supply current with the predetermined time T'.

Further, since the transient power supply current of the logic gate monotonously decreases after reaching the peak value as depicted in FIG. 2, the power supply current of the CMOS IC shown in FIG. 3 monotonously decreases after the output transition time of the last-switching logic gate. That is, in a fault-free CMOS IC, letting the output transition time of the last-switching logic gate be represented by $\tau_{max}$ and the instantaneous value of the transient power supply current at the time $\tau_{max}$ be represented by I', the transient power supply current of the CMOS IC will not become larger than the value I' after the time $\tau_{max}$.

By measuring the instantaneous value of the transient power supply current of the CMOS IC at a predetermined time through utilization of the above principle, it is possible to detect the delay fault in the circuit under test. The current value I', which is used as the criterion for judging the fault detection, is the value of the power supply current at the time when the output from the last logic gate on the path under test reaches the value one half that of the power supply voltage. The current value I' can be obtained with a circuit simulation for the circuit under test or from statistic data by a real device.

Delay Fault Detecting Method (Using an Instantaneous Value of the Transient Power Supply Current)

Next, a description will be given of a method for detecting the delay fault through utilization of an instantaneous value of the transient power supply current. This method is one that measures an instantaneous value of the transient power supply current of the circuit under test at a predetermined time and compares the measured value with the transient power supply current value of a golden circuit free from the delay fault. The basic principle of this method is shown in FIG. 7. FIG. 7A depicts input and output voltages $V_{IN}$ and $V_{OUT}$ of a path, and FIG. 7B depicts the transient power supply current.

As described previously, in the CMOS IC the maximum value $t_{pd,max}$ of the delay time in the paths $P_1, P_2, ..., P_n$ is given by Eq. (14). Further, as referred to previously, since the output transition time of the logic gate coincides with the time of the peak or trailing edge of the transient power supply current of the logic gate, the maximum time $\tau_{max}$ corresponds to the time $\tau_{IDD}$ of the last peak or trailing edge of the transient power supply current waveform $I_{DDT}$ of the circuit. Since the power supply current $I_G$ of the logic gate can be approximated using a triangular wave, and since $G_{final}$ is the last gate to switch, there is no logic circuit after $\tau_{max}$ which has the peak of its power supply current. Accordingly, at time t where $t \ge \tau_{max}$, a power supply current waveform function $i_{DDT}(t)$ is a monotonously decreasing function. That is, letting the time function of the power supply current waveform be represented by $i_{DDT}(t)$ and the instantaneous value of the power supply current at the time $\tau_{max}$ be represented by $$I'=_{DDT}(\tau_{max}) \quad (19)$$

The following equation holds at the time t where $t \geq \tau_{max}$:

$$i_{DDT}(t) \leq i_{DDT}(\tau_{max}) = I', \quad t \geq \tau_{max} \quad (20)$$

For normal circuit operation, the maximum path delay time $t_{pd,max}$ needs to be smaller than the upper limit value T' ($= T_{CLK} - T_{SKW} - T_{SU}$) of the delay time.

$$T_{pd,max} = \tau_{max} - \tau_0 < T' \quad (21)$$

Accordingly, when the circuit is fault-free, the following equation holds from Eq. (20) at the time t where $t = T' + \tau_0 > \tau_{max}$.

$$i_{DDT}(T' + \tau_0) \leq I' \quad (22)$$

If the instantaneous value of the transient power supply current waveform $i_{DDT}$ at the time $T' + \tau_0$ is larger than the value I', that is, if $$i_{DDT}(T' + \tau_0) > I' = i_{DDT}(\tau_{max}) \quad (23)$$

it follows that $$\tau_{max} > T' + \tau_0 \quad (24)$$

$$\therefore t_{pd,max} = \tau_{max} - \tau_0 > T' \quad (25)$$

because $T' + \tau_0$ cannot be larger than $\tau_{max}$. In the path of the largest delay time $t_{pd}$,max, the signal propagation lags behind the system clock. That is, the delay fault is present in the circuit. Accordingly, that the power supply current value $i_{DDT}(T' + \tau_0)$ at the time $T' + \tau_0$ is larger than I' indicates the presence of the delay fault in any one of the activated paths. Conversely, the power supply current value $i_{DDT}(T' + \tau_0)$ smaller than I' indicates the absence of the delay fault in any of the activated paths.

Delay Fault Present: $i_{DDT}(T' + \tau_0) \leq I'$

Delay Fault Absent: $i_{DDT}(T' + \tau_0) > I'$ \quad (26)

This relationship is shown in FIG. 7.

As described above, the delay fault in the circuit can be detected by comparing the instantaneous value of the power supply current value $I_{DDT}$ at a predetermined time with the $I_{DDT}$ level of a fault-free circuit.

Integral Value of Transient Power Supply Current

Further, from Eqs. (3) and (4), time integrals $Q_{Sr}$ and $Q_{Sf}$ of short circuit currents $I_{Sr}$ and $I_{Sf}$ are given by $$Q_{Sr} = \int_{-\infty}^{\infty} I_{Sr} dt = \frac{I_{Smax}(V_{DD} - V_{THN} - V_{THP})}{2V_{DD}} t_r \quad (27)$$

$$Q_{Sf} = \int_{-\infty}^{\infty} I_{Sf} dt = \frac{I_{Smax}(V_{DD} - V_{THN} - V_{THP})}{2V_{DD}} t_f \quad (28)$$

Accordingly, the integral $Q_S$ of the short circuit current flowing through the logic gate at the time of switching is given by $$Q_S \equiv \int_{-\infty}^{\infty} I_S dt = \frac{I_{Smax}(V_{DD} - V_{THN} - V_{THP})}{2V_{DD}} t_f \propto T_f \quad (29)$$

where $t_r$ is the input signal transition time. That is, the integral $Q_S$ of the short circuit current $I_S$ ($I_{Sr}$ or $I_{Sf}$) flowing into the logic gate is in proportion to the input transition time $t_r$ of the logic gate. Further, it will be seen that the integral $Q_S$ is irrespective of whether the direction of the input signal transition is a rising or falling transition.

From Eq. (5) the integral $Q_C$ of the charging current $I_C$ to the output load capacitance $C_{load}$ of the CMOS inverter is given by $$Q_C = \int_{-\infty}^{\infty} I_C dt = \int_{-\infty}^{\infty} C_{load} \frac{dv_{out}(t)}{dt} dt \quad (30)$$
$$= C_{load}[v_{out}(t)]_{-\infty}^{\infty} = C_{load}(V_{DD} - 0) = C_{load} V_{DD}$$

The integral $Q_C$ is not dependent on the input transition time $t_r$ of the CMOS inverter.

Accordingly, the integrals $Q_{Gf}$ and $Q_{Gr}$ of transient currents $I_{Gf}$ and $I_{Gr}$ flowing through the logic gate are calculated from Eqs. (1), (2), (29) and (30) as follows:

$$Q_{Gf} = \quad (31)$$
$$\int_{-\infty}^{\infty} (I_{Sf} + I_C) dt = \frac{I_{Smax}(V_{DD} - V_{THN} - V_{THP})}{2V_{DD}} t_T + C_{load} V_{DD} \propto t_T$$

$$Q_{Gr} = \int_{-\infty}^{\infty} I_{Sr} dt = \frac{I_{Smax}(V_{DD} - V_{THN} - V_{THP})}{2V_{DD}} t_T \propto t_T \quad (32)$$

That is, the integral of the transient current of the logic gate is in proportion to its input transition time. FIG. 8 is a graph showing the results of a circuit simulation about variations in the integral of the transient current of the inverter when the input transition time of the inverter is changed. The graph of FIG. 8 also demonstrates that the discussion on Eqs. (31) and (32) is correct.

The CMOS IC depicted in FIG. 3 is a combination of four inverters ($G_1$, $G_2$, $G_3$, $G_4$) connected in series, and the currents ($I_{G1}$, $I_{G2}$, $I_{G3}$, $I_{G4}$) flowing through the inverters are usually provided from one power supply. On this account, the transient power supply current response $I_{DDT}$ of the IC is expressed as the sum of currents flowing through the respective logic gate as depicted in FIG. 3C (Eq. (6)). Accordingly, the integral $Q_{DDT}$ of the transient power supply current $I_{DDT}$ is also expressed by Eq. (33) as the sum of integrals $Q_{Gn}$ (where $1 \leq n \leq N$) of the current flows through the respective logic gates. N is the number of logic gates which are switched by the input test pattern sequence, and in the case of FIG. 3A, N=4.

$$Q_{DDT} = \int_{-\infty}^{\infty} I_{DDT} dt = \int_{-\infty}^{\infty} \left( \sum_{n=1}^{N} I_{Gn} \right) dt = \sum_{n=1}^{N} \int_{-\infty}^{\infty} I_{Gn} dt = \sum_{n=1}^{N} Q_{Gn} \quad (33)$$

In the example of FIG. 3, the integral $Q_{DDT}$ of the transient power supply current $I_{DDT}$ is expressed as the sum of integrals ($Q_{G1}$, $Q_{G1}$, $Q_{G3}$, $Q_{G4}$) of the current flows through the respective inverters.

Since the integrals $Q_{Gn}$ (where $1 \leq n \leq N$) of the current flows through the respective logic gates are in proportion to the input transition times $t_m$ (where $1 \leq n \leq N$) of the respective logic gates, the integral $Q_{DDT}$ is given by a linear polynomial of $t_m$ (where $1 \leq n \leq N$). For example, in the FIG. 3 example, the integral $Q_{DDT}$ is given by a linear polynomial of the input transition times ($t_{r1}$, $t_{r2}$, $t_{r3}$, $t_{r4}$) of the respective inverters; in general, it is given by the following equation.

$$Q_{DDT} = \sum_{n=1}^{N} Q_{Gn} = \sum_{n=1}^{N} Q_{Sn} + \sum_{n=1}^{N} Q_{Cn} = \sum_{n=1}^{N} a_n t_{Tn} + b \quad (34)$$

where $a_n$ is a proportional coefficient between the integral $Q_{Sn}$ of the short circuit current of the logic gate $G_n$ and its input transition time $t_{Tn}$, and b is a constant term that is expressed as the sum of charging currents $Q_{Cn}$ flowing into the respective logic gates.

Open Fault

The use of the integral of the transient power supply current permits detection of the delay fault in the path under test and the delay fault resulting from the open fault.

The open fault allows a small current flow through the disconnected point, and hence it can be modeled using a large resistance $R_{open}$. FIG. 9A depicts an example of a CMOS inverter that has an open fault in its input. That is, it can be shown to have a resistance element of the large resistance $R_{open}$ connected in series to the input signal line A. When a signal transition takes place as depicted in FIG. 9B, a signal transition in the signal line A' succeeding the disconnected point is delayed by the open fault as depicted in FIG. 9C. Letting the resistance of the open fault be represented by $R_{open}$ and the parasitic capacitance in the input of the inverter by $C_{in}$, the signal transition time $t_r$ in the signal line A' is given by $$t_r \approx t_{T,typ} + 2.2 R_{open} C_{in} \quad (35)$$

where $t_{T,typ}$ is a typical value of the transition time of the input signal when no fault is present. The transition time $t_T$ was calculated as the time necessary for the voltage value to rise from $0.1 V_{DD}$ up to $0.9 V_{DD}$ (or for the voltage value to fall from $0.9 V_{DD}$ down to $0.1 V_{DD}$). $2.2 R_{open} C_{in}$ is the time needed for the parasitic capacitance ($C_{in}$) to rise from $0.1 V_{DD}$ UP to $0.9 V_{DD}$; this value was calculated by $\log_e(0.9 V_{DD}/0.1 V_{DD}) \times R_{open} C_{in}$. That is, the increment of the input signal transition time of the inverter is in proportion to the resistance value $R_{open}$ of the open fault. Accordingly, when an open fault is present in the input of a k-th inverter on the path under test, the integral $Q_{DDT}$ of the power supply current of the CMOS IC is given by the following equation (36) from Eqs. (34) and (35), and it varies linearly with the resistance value $R_{open}$ of the open fault, and the increment is in proportion to the resistance value $R_{open}$.

$$Q_{DDT} = \sum_{n=1}^{N} a_n t_{Tn} + b = \left( \sum_{n=1}^{N} a_n t_{Tn,typ} + b \right) + 2.2 a_k C_{in} R_{open} \quad (36)$$

$$= Q_{DDT,typ} + 2.2 a_k C_{in} R_{open} \propto R_{open}$$

where $Q_{DDT,typ}$ is a typical value of the integral of the power supply current in the case of no fault. $2.2 a_k C_{in} R_{open}$ in the second term on the right-hand side of Eq. (36) is the amount of addition based on the open fault in the input of the k-th inverter. Eq. (36) also agrees with the results of simulation about variations in the integral $Q_{DDT}$ with the resistance value $R_{open}$ shown in FIG. 10. Plotted in FIG. 10 are variations in the integral $Q_{DDT}$ with the resistance value $R_{open}$ of the open fault when the open fault is present in the input signal line IN2 of the inverter G2 in the circuit shown in FIG. 3.

Accordingly, it is possible to detect an open fault in the input stage of a logic gate on the path under test by measuring the integral $Q_{DDT}$ of the transient power supply current and comparing it with the integral $Q_{DDT,typ}$ of the transient power supply current of a fault-free circuit. In the actual CMOS manufacturing process, variations in process parameters cause variations in the integral of the transient power supply current within the range Of $Q_{DDT,typ} \pm \Delta_Q$ as depicted in FIG. 11, where $\Delta_Q$ is a variation in the integral of the transient power supply current. Hence, when the integral $Q_{DDT}$ is larger than the upper limit value $Q_{DDT,typ} + \Delta_Q$ of the integral of the transient power supply current in a fault-free circuit, it can be decided that an open fault is present on the path under test. That is, the integral $Q_{DDT}$ smaller than the upper limit value $Q_{DDT,typ} + \Delta_Q$ indicates the absence of the open fault in the CMOS IC, whereas $Q_{DDT}$ larger than $Q_{DDTi,typ} + \Delta_Q$ indicates the presence of the open fault in the CMOS IC.

Open Fault Absent: $Q_{DDT} \leq Q_{DDT,typ} + \Delta_Q$

Open Fault Present: $Q_{DDT} > Q_{DDT,typ} + \Delta_Q$ (37)

$Q_{DDT,typ}$ and $\Delta_Q$ can be derived, for example, by a simulation about process variations.

Method for Detecting Delay Fault by Fault in Input Stage (Using the Integral of the Transient Power Supply Current)

Next, a description will be given of a method for detecting the delay fault through utilization of the time integral of the transient power supply current described above. This method is to evaluate the delay fault by measuring the integral of the transient power supply current of the circuit under test and comparing it with a predetermined-value.

The delay time $t_{gd}$ of a logic gate is in proportion to the input signal transition time $t_T$, and is given by the following equation (Neil H. E. Weele, "Principles of CMOS VLSI Design-A Systems Perspective," Second Edition, pp.

216–217, Eqs. 4.52 and 4.53, Addison-Weely Publishing Company, 1999).

$$t_{gd} = t_{gd,step} + \frac{1}{6}\left(1 - 2\frac{V_{TH}}{V_{DD}}\right)t_T \quad (38)$$

where $t_{gd,step}$ is the delay time of a fault-free inverter for a step input with no transition time. Further, $V_{TH}$ is a threshold voltage of a p-MOS or n-MOS, which is given by $V_{TH}=V_{THN}$ for a rising transition of the input and by $V_{TH}=V_{THP}$ for a falling transition of the input. Since the input transition time of the logic gate is given by Eq. (35), the delay time $t_{gd}$ of a logic gate having an open fault in the input signal line that can be modeled by the resistance $R_{open}$ can be calculated by substituting Eq. (35) into Eq. (38).

$$\begin{aligned} t_{gd} &= t_{gd,step} + \frac{t_T}{6}\left(1 - 2\frac{V_{TH}}{V_{DD}}\right) \\ &= t_{gd,step} + \frac{t_{T,typ}zzz; 2.2R_{open}C_{in}}{6}\left(1 - 2\frac{V_{TH}}{V_{VV}}\right) \\ &= t_{gd,typ} + \frac{t_{T,typ}}{6}\left(1 - 2\frac{V_{TH}}{V_{DD}}\right) + \frac{2.2C_{in}}{6}\left(1 - 2\frac{V_{TH}}{V_{DD}}\right)R_{open} \\ &= t_{gd,typ} + \frac{2.2C_{in}}{6}\left(1 - 2\frac{V_{TH}}{V_{DD}}\right)R_{open}\infty R_{open} \end{aligned} \quad (39)$$

In the above, $t_{gd,typ}$ is a typical value of the delay time of a fault-free logic gate. That is, the delay time of a logic gate with the open fault varies with the resistance value $R_{open}$ of the fault, and the increment δ of the gate delay time is in proportion to the resistance value $R_{open}$. Therefore, when an open fault is present in the input of any one of the logic gates on the path under test, the delay time $t_{pd}$ of the path under test is also in proportion to the resistance value $R_{open}$. This can be understood from the fact that substituting Eq. (39) into Eq. (10) gives the following equation (40).

$$\begin{aligned} t_{pd} &= \sum_{i=1}^{m} t_{gdi} \\ &= \sum_{i=1}^{m} t_{gd,typ} + \frac{2.2C_{ink}}{6}\left(1 - 2\frac{V_{TH}}{V_{DD}}\right)R_{open} \\ &= t_{pd,typ} + \frac{2.2C_{ink}}{6}\left(1 - 2\frac{V_{TH}}{V_{DD}}\right)R_{open}\infty R_{open} \end{aligned} \quad (40)$$

This also agrees with the results of a simulation for variations in the path delay time $t_{pd}$ with respect to the resistance value $R_{open}$ shown in FIG. 12. Plotted in FIG. 12 are variations in the path delay time $t_{pd}$ with respect to the resistance value $R_{open}$ of the open fault in the input signal line of the inverter G2 in the circuit depicted in FIG. 3A.

The integral $Q_{Sk}$ of the short circuit current of a logic gate $G_k$ on the path P when an open fault is present in the input of the gate $G_k$ can be calculated from Eqs. (29) and (35) as follows:

$$\begin{aligned} Q_{Sk} &= \frac{I_{Smax}(V_{DD} - V_{THN} - V_{THP})}{2V_{DD}}t_{Tk} \\ &= \frac{I_{Smax}(V_{DD} - V_{THN} - V_{THP})}{2V_{DD}}(t_{Tk,typ} + 2.2R_{open}C_{ink}) \\ &= \frac{I_{Smax}(V_{DD} - V_{THN} - V_{THP})}{2V_{DD}} \cdot t_{Tk,typ} + \frac{I_{Smax}(V_{DD} - V_{THN} - V_{THP})}{2V_{DD}} \cdot 2.2R_{open}C_{ink} \\ &= Q_{Sk,typ} + \frac{2.2I_{Smax}(V_{DD} - V_{THN} - V_{THP})C_{ink}}{2V_{DD}} \cdot R_{open} \end{aligned}$$

Therefore, the integral $Q_{DDT}$ of the transient power supply current of the IC is calculated from Eq. (34) as follows:

$$\begin{aligned} Q_{DDT} &= \sum_{n=1}^{N} Q_{Gn} \\ &= \sum_{n=1}^{N} Q_{Sn} + \sum_{n=1}^{N} Q_{Cn} \\ &= \sum_{n=1}^{N} Q_{Sn,p} + Q_{Sk,typ} + \frac{2.2I_{Smax}(V_{DD} - V_{THN} - V_{THP})C_{ink}}{2V_{DD}} \cdot R_{open} + \sum_{n=1}^{N} Q_{Cn} \\ &= \sum_{n=1}^{N} Q_{Sn,p} + \sum_{n=1}^{N} Q_{Cn} + \frac{2.2I_{Smax}(V_{DD} - V_{THN} - V_{THP})C_{ink}}{2V_{DD}} \cdot R_{open} \\ &= Q_{DDT,typ} + \frac{2.2I_{Smax}(V_{DD} - V_{THN} - V_{THP})C_{ink}}{2V_{DD}} \cdot R_{open} \end{aligned} \quad (41)$$

and the integral $Q_{DDT}$ of the transient power supply current of the circuit is also in proportion to the resistance value $R_{open}$ of the open fault.

Accordingly, from Eqs. (40) and (41), the delay time $t_{pd}$ of the path P with the open fault linearly varies with respect to the integral $Q_{DDT}$ of the transient power supply current of the CMOS IC. This also agrees with the results of the simulation about variations in the delay time $t_{pd}$ with respect to the integral value $Q_{DDT}$ shown in FIG. 13. Plotted in FIG. 13 are variations in the delay time $t_{pd}$ with respect to the integral value $Q_{DDT}$ of the transient power supply current when an open fault is present in the input signal line of the inverter G2 in the circuit of FIG. 3A.

Substituting $R_{open}$ obtained from Eq. (41) into Eq. (40) gives $$t_{pd} = t_{pd,typ} + \frac{2.2C_{ink}}{6}\left(1 - 2\frac{V_{TH}}{V_{DD}}\right)R_{open} \quad (42)$$

$$= t_{pd,typ} + \frac{2.2C_{ink}}{6}\left(1 - 2\frac{V_{TH}}{V_{DD}}\right) \cdot \frac{(Q_{DDT} - Q_{DDT,typ}) \cdot 2V_{DD}}{2.2I_{Smax}(V_{DD} - V_{THN} - V_{THP})C_{ink}}$$

$$= t_{pd,typ} + \frac{V_{DD} - 2V_{TH}}{3I_{Smax}(V_{DD} - V_{THN} - V_{THP})}(Q_{DDT} - Q_{DDT,typ})$$

Letting $Q_{max}$ represent the integral of the transient power supply current at the time when the path delay time $t_{pd}$ reaches the permissible upper limit value T' of the delay time, the following equation (43) is obtained by calculating $Q_{max}$ with $t_{pd}$=T' and $Q_{DDT}$=$Q_{max}$ in Eq. (42).

$$Q_{max} = Q_{DDT,typ} + \frac{3I_{Smax}(V_{DD} - V_{THN} - V_{THP})}{V_{DD} - 2V_{TH}}(T' - t_{pd,typ}) \quad (43)$$

The value $Q_{max}$ is the upper limit value of the integral $Q_{DDT}$ of the transient power supply current of a CMOS IC with no delay fault. That is, the value $Q_{DDT}$ smaller than the upper limit value $Q_{max}$, indicates the absence of the delay fault in the CMOS IC, and the value $Q_{DDT}$ larger than the value $Q_{max}$ indicates the presence of the delay fault.

Delay Fault Absent: $Q_{DDT} \leq Q_{max}$

Delay Fault Present: $Q_{DDT} > Q_{max}$ (44)

As described above, the circuit can be tested for the delay fault by comparing the integral $Q_{DDT}$ of the transient power supply current with the predetermined value $Q_{max}$. The predetermined value $Q_{max}$ can be obtained by a circuit simulation or from statistic data by Eq. (43).

The transient power supply current is a transient current flowing across the power supply terminal of the IC, and its observability higher than a voltage signal is ensured. Hence, the delay fault detecting scheme using the transient power supply current assures higher observability for the delay fault than does a delay fault detecting scheme using the voltage signal. For example, the delay fault detecting scheme using a voltage signal, for instance, cannot detect the delay fault unless the voltage signal propagates to the output signal line of an IC. In contrast thereto, the delay fault detecting scheme using the transient power supply current signal can detect the delay fault since it is possible to measure a transient power supply current signal of a pulse width corresponding to the delay time of the path over which the voltage signal has propagated even if the voltage signal does not propagate to the output signal line of the IC.

Accordingly, the delay fault detecting scheme using the transient power supply current does not require the propagation of the voltage signal to the output signal line of the IC, and hence it is less limited by the test pattern generation than the conventional delay fault detecting scheme using the voltage signal. Accordingly, test patterns can be generated with more ease. In the extreme, for example, even if test pattern sequences are randomly generated and applied to the circuit under test, the delay fault detecting scheme using the transient power supply current permits detection of a delay fault in the path that is activated by the test pattern sequences applied thereto.

Fault List Making Method (Fault Simulation)

Next, a description will be given of the fault list making method or the fault simulation method according to the present invention. FIG. 14 illustrates an example of a CMOS IC under test. The illustrated IC under test has three input terminals I1, I2 and I3, two output terminals O1 and O2, three internal signal nodes N1, N2 and N3, and five logic gates G1, G2, G3, G4 and G5. The input terminal I1 is connected to the input of the inverter logic gate G1, which has its output connected via the node N1 to the one input of the NAND logic gate G3. The input terminals I2 and I3 are connected to the input side of the NAND logic gate G2, which has its output connected via the node N2 to the other input of the logic gate G3, which has its output connected via the node N3 to the input of the inverter logic gate G4 and the one input of the NOR logic gate G5. The input terminal I3 is connected to the other input of the logic gate G5, and the logic gates G4 and G5 have their outputs connected to the output terminals O2 and O3. Though not shown, the logic gates G1 to G5 are connected to a common power supply terminal.

In FIG. 15 there are depicted the results of a fault simulation performed on the above-mentioned CMOS IC under test. In FIG. 15, the first column shows identifiers of test pattern sequences; the second column shows input signals (test pattern sequences) applied to the input terminals I1, I2 and I3 of the CMOS IC; the third column shows signals that occur at the internal signal nodes N1, N2 and N3 of a fault-free CMOS IC under test upon application thereto of the respective test pattern sequences; and the fourth column shows signals that occur at the output terminals O1 and O2 of the fault-free CMOS IC upon application thereto of the respective test pattern sequences. The signals "0," "1," "R" and "F" in the second, third and fourth columns show: a normally-low signal <"0," "0"> (the first element in the angle brackets indicating an initial signal value and the second element a final signal value); a normally-high signal (<"1," "1">); a rising signal from the low to the high level (<"0," "1">); and a falling signal from the high to the low level (<"1," "0">). Each test pattern is composed of two test patterns; for example, a test pattern T1="00R" means I1, I2, I3=<"000," "001">. That is, it represents applying "0,", "0," "0" and then "0," "0," "1" to the input terminals I1, I2 and I3, respectively. The fifth column shows sets of faulty logic gates (faulty-point list) detectable by the testing using the transient power supply current upon application of the respective test pattern sequences.

When the logic gate has a delay or open fault, its switching operation becomes slow and its transient power supply current waveform changes accordingly, developing an abnormality in the transient power supply current of the IC under test. Hence, by measuring whether the application of a certain test pattern sequence causes an abnormality in the transient power supply current, it can be decided whether the logic gates are faulty or not which perform the switching operation upon application thereto of the above-mentioned input test pattern sequences. For example, upon application of the test pattern sequence T2 to the CMOS IC depicted in FIG. 14, the logic gates G2, G3, G4 and G5 in the IC perform switching, generating transition signals at the internal signal nodes (signal lines) N2, N3 and the output terminals O1, O2 shown in the FIG. 14. Accordingly, when a fault is present in any one of the logic gates G2 to G5, an abnormality is observed in the transient power supply current during the transient power supply current testing using the test pattern sequence T2. That is, faults of the logic gates G2 to G5 can be detected by the transient power supply current testing using the test pattern sequence T2. Hence, a fault-point list for the test pattern sequence T2 can be calculated as GT2={G2, G3, G4, G5} by the above fault simulation.

In the manner described above, it is possible to make a list of faults detectable by a certain test pattern sequence for each logic gate. Moreover, the fault list making method according to the present invention is not limited specifically to the generation of the fault list for each logic gate, but by assuming the presence of faults in the signal lines of the IC, the fault list can be made for each signal line.

FIG. 16 illustrates a CMOS IC under test, which has three input terminals I1, I2 and I3, two output terminals O1 and O2, five logic gates G1, G2, G3, G4 and G5, and 12 signal lines L1, L2, . . . , L12. The signal lines are assumed to include input and output signal lines, and the branched signal lines are regarded as different signal lines. Assume that the output signal lines L11 and L12 are connected to output buffers G6 and G7, respectively. The input terminal I1 is connected via the signal line L1 to the input of the inverter logic gate G1. The input terminals I2 and I3 are connected to the input of the NAND logic gate G2 via the signal lines L2, L3 and L4, respectively. The logic gates G1 and G2 have their outputs connected to the input of the NAND logic gate G3 via the signal lines L6 and L7, respectively. The logic gate G3 has its output connected to the input of the inverter logic gate G4 and via the signal lines L8 and L9 and to the one input of the NOR logic gate G5 via the signal lines L8 and L10. The input terminal I3 is connected to the other input of the logic gate G5 via the signal lines L3 and L5. The logic gate G4 has its output connected to the output terminal O1 via the signal line L11 and the buffer G6. The logic gate G5 has its output connected to the output terminal O2 via the signal line L12 and the buffer G7. Though not shown, the logic gates G1 to G5 and the output buffers G6 and G7 have their power supply terminals connected to a common power supply.

In FIG. 17 there are depicted the results of a fault simulation performed on the above-mentioned CMOS IC under test. In FIG. 17, the first column shows identifiers of test pattern sequences; the second column shows input signals that are applied to the input terminals I1, I2 and I3 of the CMOS IC; the third column shows signals that occur in the signal lines L1 to L12 of a fault-free CMOS IC under test upon application thereto of the respective test pattern sequences; and the fourth column shows signals that occur at the output terminals O1 and O2 of the fault-free CMOS IC upon application thereto of the respective test pattern sequences. The signals "0," "1," "R" and "F" in the second, third and fourth columns are identical with those described previously with reference to FIG. 15. The fifth column shows sets of faulty logic signal lines, i.e. a list of faulty points, detectable by the testing using the transient power supply current upon application of the respective test pattern sequences. When a signal line in the IC has an open fault, the switching operation of the logic gate having its input connected to the faulty signal line becomes slow and the transient power supply current waveform of the logic gate changes accordingly, developing an abnormality in the transient power supply current of the IC under test. Hence, by measuring or observing whether the application of a certain test pattern sequence causes an abnormality in the transient power supply current, it can be decided whether the logic gates having their inputs connected to the signal lines in which the logic signal values change are faulty or not when they perform the switching operation upon application of the above-mentioned input test pattern sequences to the signal lines.

Consider, for example, that the test pattern sequence T6 is applied to the CMOS IC shown in FIG. 16. When no fault is present, signals in the respective signal lines are such as indicated by 0 and 1, and logic signal values change in the signal lines L2, L7, L8, L9, L10 and L11 in the CMOS IC accordingly, and further, switching takes place in the logic gates G2, G3 and G4 and in the output buffer G6. The logic signal value changes in the signal line L10 but no switching takes place in the logic gate G5 having one of its inputs connected to the signal line L10. Accordingly, when a fault is present in any one of the signal lines L2, L7, L8, L9 and L11, an abnormality is observed in the transient power supply current during the transient power supply current testing using the test pattern sequence T6. That is, faults in the signal lines L2, L7, L8, L9 and L11 can be detected by the transient power supply current testing using the test pattern sequence T6. Thus, a fault list for the test pattern sequence T6 can be calculated as LT 6={L2, L7, L8, L9, L11} by the above fault simulation.

In the manner described above, a list of faults detectable by the application of a certain test pattern sequence in each signal line can be made. Furthermore, the fault simulation method and the fault simulator according to the present invention are not limited specifically to predicting faulty points of signal lines having connected thereto logic gates, but are also applicable to predicting faults of signal lines in logic gates by assuming faults therein.

In addition, the method and apparatus according to the present invention are not limited specifically to the CMOS IC but are applicable to other semiconductor ICs as well.

BRIEF DESCRIPTION OF THE DRAWINGS

FIG. 15 is a table showing, by way of example, the results of a fault simulation on the CMOS IC of FIG. 14;

FIG. 17 is a table showing, by way of example, the results of a different fault simulation on the CMOS IC of FIG. 16;

FIG. 24 is a table showing an example of the fault list of the circuit of FIG. 14 made for each signal propagation path;

FIG. 25 is a table showing an example of the fault list of the circuit of FIG. 16 made for each signal propagation path;

DETAILED DESCRIPTION OF THE PREFERRED EMBODIMENTS

Now, a description will be given of embodiments of the present invention.

Figure 18:
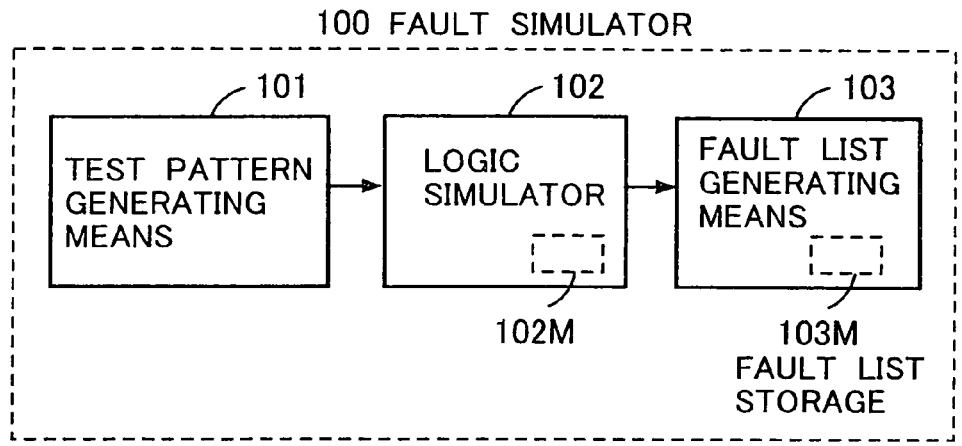
FIG. 18 is block diagram illustrating the configuration of an embodiment of the fault simulator according to the present invention.

FIG. 18 illustrates in block form an example of the construction of a fault simulator for use in an embodiment of the present invention. The fault simulator, denoted generally by 100, comprises: test pattern generating means 101 which generates test patterns one after another for input to a semiconductor IC under test; a logic simulator 102 which performs logic simulations of the operation of the IC under test by sequentially applying thereto the test patterns from the test pattern generating means 101, then calculates logic signal value sequences occurring in signal lines of the IC under test, and stores them in a memory 102M in correspondence with the respective test pattern sequences; and a fault list generating means 103 which generates list of faults detectable by a transient power supply current testing for each test pattern sequence through the use of the logic signal value sequence for each signal line calculated by the logic simulator 102, and stores the fault list in a fault list storage 103M. The test pattern generating means 101, the logic simulator 102 and the fault list generating means 103 may be formed by either hardware or software.

For example, when the semiconductor IC under test has three input terminals, the test pattern generating means 101 is formed by three pseudo random pattern sequence generators, which are initialized to different values and driven in synchronization using the same clock to thereby generate random pattern sequences. The outputs from the three pseudo random pattern sequence generators are used as test patterns for each clock. Alternatively, a three-bit counter is used to count clocks, and for each clock the count value expressed by three bits is taken out as a test pattern. It will easily be understood that these schemes can be implemented by software. It is also possible to prestore required test patterns and read them out one after another. At any rate, for example, the number of shift stages of a pseudo random generator is selected or a sufficient number of test patterns is prestored in a memory so that various test patterns can be generated which provide sufficient data necessary for detecting, as detectable spots, delay faults in any logic gates or open faults in any signal lines in the semiconductor IC under test.

With the logic simulator 102 by software, operations in respective logic gates of the semiconductor IC under test are sequentially conducted by software for each test pattern input thereto, and the operation results (logic signal values) for each test patterns are stored in correspondence with the signal lines where the operation results are provided. In this way, the logic signal value sequence in each signal line can easily be obtained. In the case of the logic simulator 102 by hardware, circuit information about the semiconductor IC is input to, for instance, a field programmable gate array (FPGA) to form a semiconductor IC under test, and upon input thereto of each test pattern, the logic signal value in each signal line is detected and stored in correspondence with the signal line. Accordingly, the logic simulator 102 is provided with the memory 102M for storing the logic signal values that are produced in respective signal lines for each test pattern. The logic simulator 102 may be such a general-purpose logic simulator as VHDL system simulator (VSS) by Synopsys. Inc. The fault list generating means 103 will be described later on.

Figure 19:
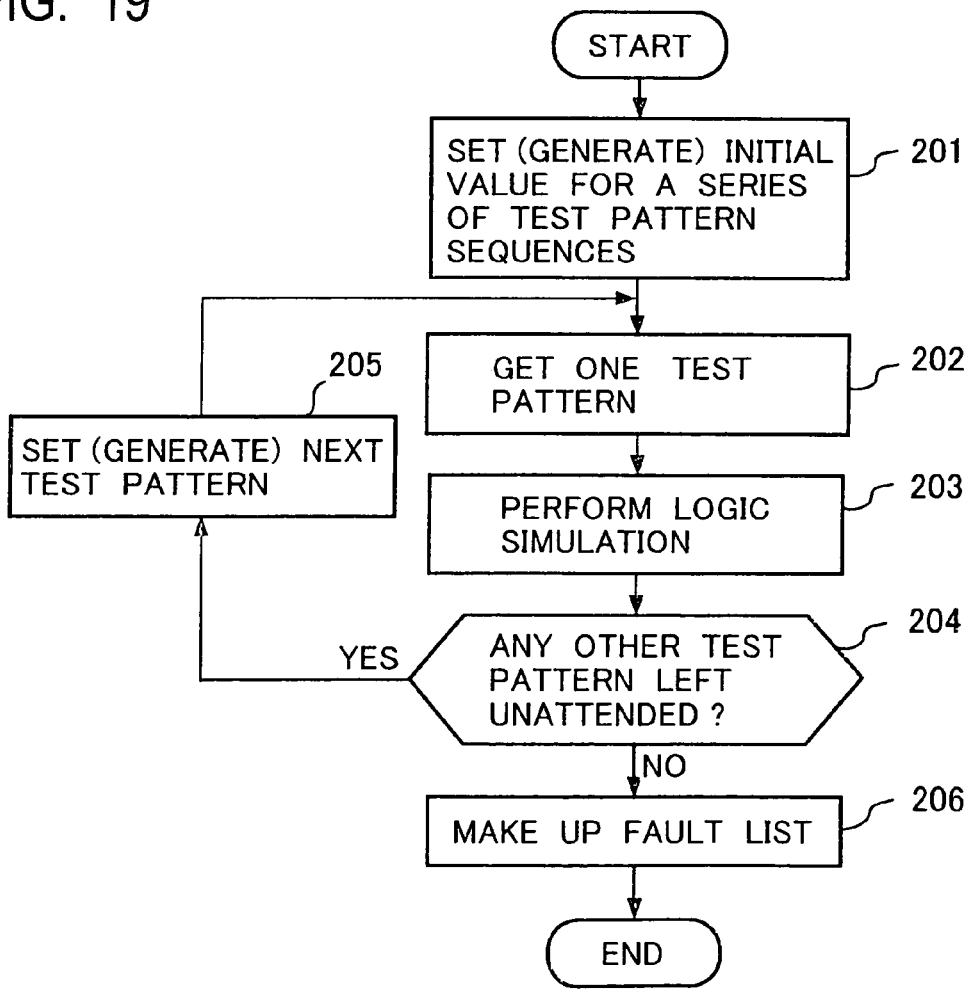
FIG. 19 is a flowchart depicting the procedure of the fault simulation method according to the present invention.

Next, a description will be given of the operations of the fault simulator 100 involved in a fault simulation of a semiconductor IC. FIG. 19 depicts the procedure of the fault simulation method according to the present invention. The simulation starts from step 201 in which the test pattern generating means 101 sets the initial value for test patterns of a series of test pattern sequences for the fault list intended to make, that is, generates a test pattern of the initial value. Then, in step 202, the logic simulator 102 receives the test pattern set in step 201. In step 203 the logic simulator 102 uses the test pattern to perform a logic simulation of the operation of the semiconductor IC under test, then calculates logic signal values in signal lines in the IC under test, and stores in the memory 102M the logic signal value for each signal line in correspondence with the test pattern. Next, in step 204 the fault simulator 100 makes a check to see if there is any test pattern left unattended in the test pattern sequence concerned. If so, the fault simulator 100 sets (generates) the next test pattern (for example, advances the operation of a pseudo random pattern generator by one clock), and repeats steps 202 and 203. When there is not found any unattended test pattern left in the series of test pattern sequences (for example, when the pseudo random pattern generator has completed one round of random pattern generation) in step 204, the fault simulator 100 goes to step 206.

Finally, in step 206 the fault list generating means 103 generates a list of faults detectable by a transient-power supply current testing for the test pattern sequences, based on the logic signal value sequences produced in respective signal lines of the IC in the above steps and stored in the memory 102M. When the test pattern sequences are each composed of two test patterns as in the afore-mentioned example, two arbitrary test patterns generated by the test pattern generating means 102 are taken out and given a test pattern sequence identification number, and the signal lines in which logic signal values change in response to the application of the test patterns are associated, as fault-detectable spots, with the test pattern sequence identification number to make the list of faults. The generation of the fault list will be described in more detail later on. The time series of the logic signal values calculated by the logic simulator 102 for respective test patterns if steps 202, 203 and 204 correspond to the time series of the test patterns in the test pattern sequence.

Figure 20:
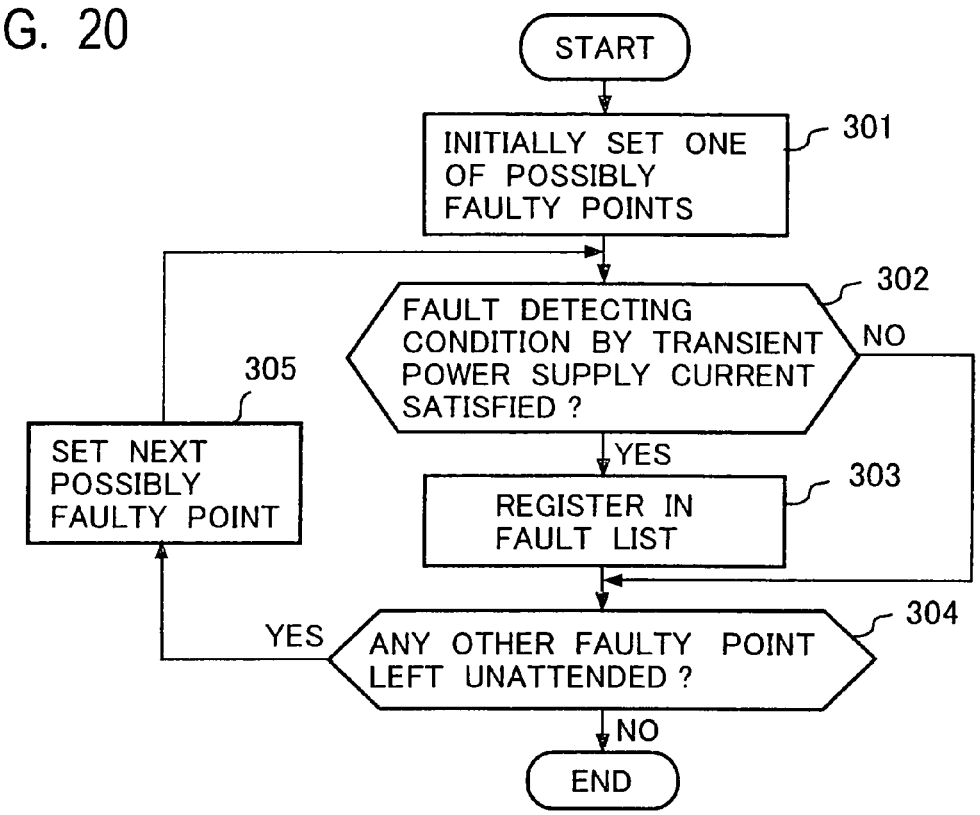
FIG. 20 is a flowchart showing the procedure of a fault list making step 206 in FIG. 19.

FIG. 20 is a flowchart depicting an example of the procedure for generating the fault list in step 206 in FIG. 19. The procedure begins with step 301 in which to select and initially set one of points that become possibly faulty in the semiconductor IC under test. This is followed by step 302 in which a check is made to determine whether the logic signal value sequence calculated by the logic simulator 102 satisfies the condition for fault detection by the transient power supply current testing when the above set point becomes faulty. If the fault detecting condition is met, the set point is registered in the fault list in step 303. If it is found in step 302 that the fault detecting condition is not satisfied, the procedure proceeds to step 304. In step 304 a check is made to see if there is present in the IC under test any other unattended points that become possibly faulty; if so, the point that becomes possibly faulty next is set in step 305, and then the procedure goes to step 302. In this way, steps 302, 303, 304 and 305 are repeated until all of the points that become possibly faulty in the IC under test are dealt with; that is, no unattended points are found in step 304, then the procedure ends.

Figure 21:
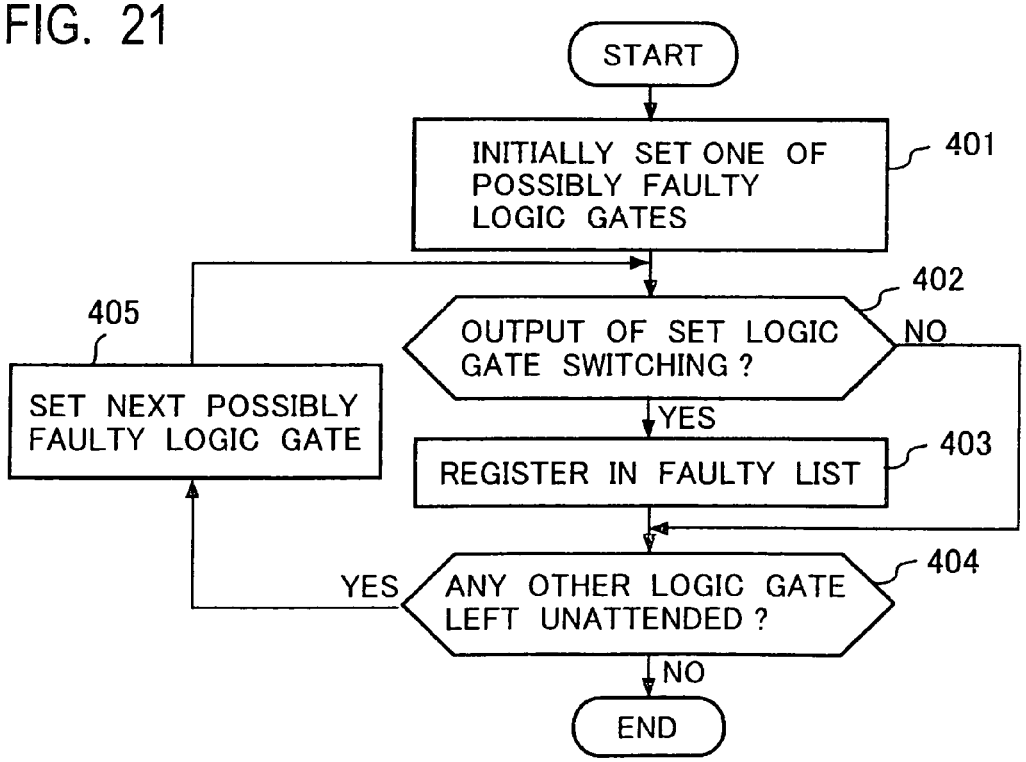
FIG. 21 is a flowchart showing the procedure of a fault list making step 206 in the case of making the list for each logic gate.

FIG. 21 is flowchart depicting an example of the procedure for generating a list of faults in logic gates in step 206 in FIG. 19. The procedure begins with step 401 in which to select and initially set one of logic gates that become possibly faulty. Next, in step 402, a check is made to determine whether a change or changeover has been made in the logic signal value sequence in the output signal line of the set logic gate, calculated by the logic simulator 102, based on the logic signal values in the output signal line of each logic gate stored for each test pattern sequence in the memory 102M in which there are stored the results of the simulation in step 203 in FIG. 19. If the logic signal value sequence in the output signal line of the above faulty logic gate has changed, then the set logic gate and the corresponding test pattern are registered in the fault list in step 403. For example, if the logic gate G1 is set in the circuit of FIG. 14, the logic signal value sequence in the output signal line (node) N1 of the logic gate G1, that is, the first logic signal value sequence "1, 1, 0, 0, . . . " in third column of the FIG. 15 table, is searched for test pattern sequences T9, T10, T11 and T12 that become R or F, and these test pattern sequences are registered for G1 in the fault list, or G1 is registered for each of those test pattern sequences T9 to T12; that is, these relationships are stored in the storage 103M to make the fault list. In this instance, faults detectable when the logic signal in the output signal line of the faulty logic gate takes a value R (a rising transition) and a value F (a falling transition), respectively, can also be registered as different faults. For instance, when the logic gate G1 is set, the fault detectable when the logic signal in its output signal line takes the value R and the fault detectable when the logic signal in its output signal line takes the value F are registered as G1R and G1F in the fault list, respectively. In the above example, since the logic signal in the output node N1 of the logic gate G1 takes the value F for any of the test patterns sequences T9, T10, T11 and T12, these test pattern sequences are registered for the fault G1F in the fault list, or G1F is registered for each of those test patterns.

If it is found in step 402 that the logic signal value sequence has not changed in the output signal line of the set logic gate, the procedure goes to step 404. In step 404 a check is made to determine whether there is still present an unattended logic gate in the semiconductor IC under test, and if such a logic gate is found, then the procedure goes to step 405 in which to set the logic gate where the next fault possibly occurs, followed by a return to step 402. In this way, steps 402, 403, 404 and 405 are repeated until the logic gates in which faults possibly develop are all attended to or dealt with, and if no unattended logic gate is found in sep 404, then the procedure ends.

If a change is found in the logic signal value sequence in the output signal line of the set logic gate, the transient power supply current of the semiconductor IC under test is measured at the time of inputting the test pattern sequence that causes the change in the logic signal value sequence. It can be decided whether the set logic gate is under the delay fault condition from the instantaneous value of the transient power supply current after a predetermined elapsed time, or the pulse width or integral of the transient power supply current as described previously. That is, in the generation of the fault list for each logic gate, to make a check to see if the logic signal value sequence has changed in the output signal line of the set logic gate is equivalent to making a check to determine whether the condition for fault detection by the transient power supply current testing is satisfied.

Figure 22:
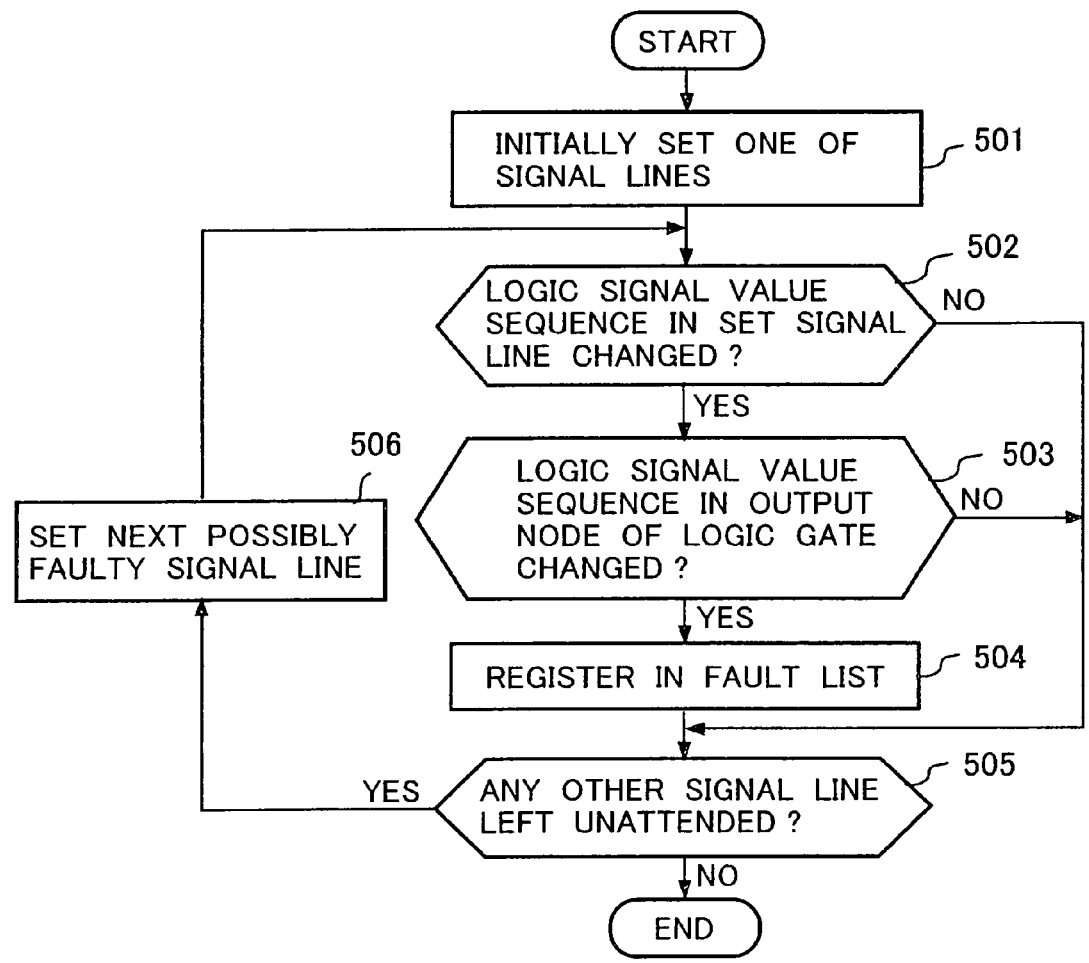
FIG. 22 is a flowchart showing the procedure of a fault list making step 206 in the case of making the list for each signal line.

FIG. 22 is a flowchart showing an example of the procedure for generating a list of faults in each signal line in step 206 in FIG. 19. The procedure begins with step 501 in which to select and initially set one of signal lines in which a fault possibly develops. Next, in step 502 a check is made to determine whether a change has been made in the logic signal value sequence in the set signal line calculated by the logic simulator 102 in step 203 in FIG. 19, based on the logic signal value sequence in the set signal line stored for each test pattern sequence in the memory 102M wherein there are stored the results of the logic simulation performed in step 203 in FIG. 19. If it is found that the logic signal value sequence has changed in the set signal line, then the procedure proceeds to step 503. For example, in the case where the signal line L2 is set in the circuit of FIG. 16, the logic signal value sequence in that signal line is the second sequence of logic signal values "0, 1, 0, 1, . . ." in the third column in the FIG. 17 table, and this logic signal value sequence is checked for R or F. In this instance, since R is found in the logic signal value sequence in association with the test pattern sequences T5, T6, T7 and T8, that is, since the logic signal value sequence has been changed by these test pattern sequences, the procedure goes to step 503. If no change is found in the logic signal value sequence in the set signal line, the procedure goes to step 505. Next, in step 503, based on the results of calculations by the logic simulator 102 (the stored contents of the memory 102M), a check is made to see if the logic signal value sequence in the output signal line of the logic gate with the set signal line connected to its input the has been changed by the test pattern sequence having caused that change in the logic signal value sequence in step 502. If it is found that the logic signal value sequence has changed, the set signal line is registered in the fault list in step 504. That is, in the above example, although the pattern sequences T5 to T8 change the logic signal value sequence in the set input signal line L2, it is the pattern sequences T6 and T8, as indicated by F in the FIG. 17 table, that changes the logic signal value sequence in the output signal line L7 of the logic gate G2 having one of its inputs connected to the set signal line L2; accordingly, the test pattern sequences T6 and T8 are registered for the set signal line L2. Alternatively, the signal line L2 is registered for T6 and T8 in the fault list. That is, the logic signal value sequence in the signal line L2 is changed by the test pattern sequences T5 to T8, but the logic gate G2 responds only to the test pattern sequences T6 and T8 to perform switching, and since no fault cannot be detected by the transient power supply current testing without switching of the logic gate G2, the test pattern sequences T6 and T8 are registered for the signal line L2. If it is found in step 503 that the logic signal value sequence in the output signal line of the logic gate having connected to its input the set signal line has not been changed by the test pattern sequence found in step 502 to have changed the logic signal value sequence in the set input line, the procedure goes to step 505. In step 505 a check is made to see if there is any other signal lines left unchecked in the semiconductor IC under test, and if so, the signal line in which the next fault possibly occur is set in step 506, followed by a return to step 502. In this way, steps 502, 503, 504, 505 and 506 are repeated until all the signal lines in which faults possibly occur are checked in the IC under test. If no signal line is found left unchecked in step 505, the procedure ends.

In the event that an open in the set signal line causes a delay fault in the logic gate having its input connected to the set signal line, it is necessary, for detecting the fault by the transient power supply current testing, that a change in the logic signal value sequence in the set signal line cause a change in the logic signal value sequence in the logic gate connected thereto. Hence, as described previously in respect of the generation of the fault list based on the set signal line, to make a check to determine whether the changeover of the logic signal value sequence in the set signal line causes the changeover of the logic signal value sequence in the output signal line of the logic gate having its input connected to the set signal line is to make a check to see if the fault detecting condition by the transient power supply current testing is satisfied.

Figure 23:
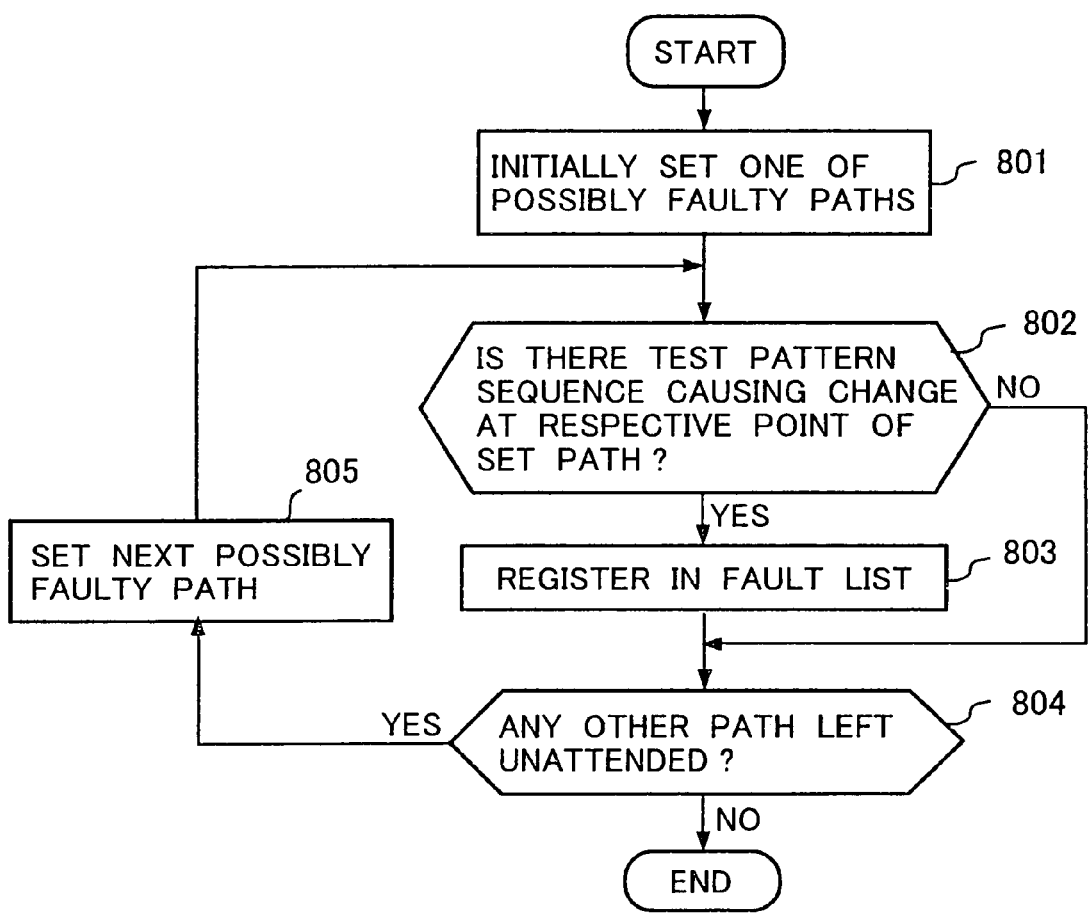
FIG. 23 is a flowchart showing the procedure of a fault list making step 206 in the case of making the list for each signal propagation path.

Turning next to FIG. 23, a description will be given of an example of the procedure for generating a list of faults in each signal propagation path. The procedure begins with step 801 in which to select and initially set one of signal propagation paths in which a fault possibly develops. Next, in step 802 it is checked, for each test pattern sequence, whether the logic signal value sequence at every point of the set signal propagation path has changed, based on stored contents of the memory 102M wherein there are stored the results of the logic simulation performed in step 203 in FIG. 19. When the logic signal sequence has changed at every point on the set signal propagation path, the corresponding test pattern sequence and the set signal propagation path are registered in the fault list in step 803. For example, in the logic simulation for each logic gate in the semiconductor IC depicted in FIG. 14, the logic signal values at each input terminal, each internal node and each output terminal changes in response to the input of each test pattern sequence as shown in FIG. 15. For instance, in the case where the set signal propagation path in which a fault possibly occur is <I1, N1, N3, O1>, the FIG. 15 table shows that I1, N1, N3 and O1 are R, F, R and F, respectively, for the test pattern sequence T9; that is, the logic signal values change at every point on this signal propagation path. Further, in the cases of the test pattern sequences T10 and T11, too, I1, N1, N3 and O1 are R, F, R and F, respectively; that is, the logic signal values change at every point on this path. Accordingly, the test pattern sequences T9, T10 and T11 are registered for the signal propagation path <I1, N1, N3, O1>; alternatively, the path <I1, N1, N3, O1> is registered for each of the test pattern sequences T9, T10 and T11.

Figure 16:
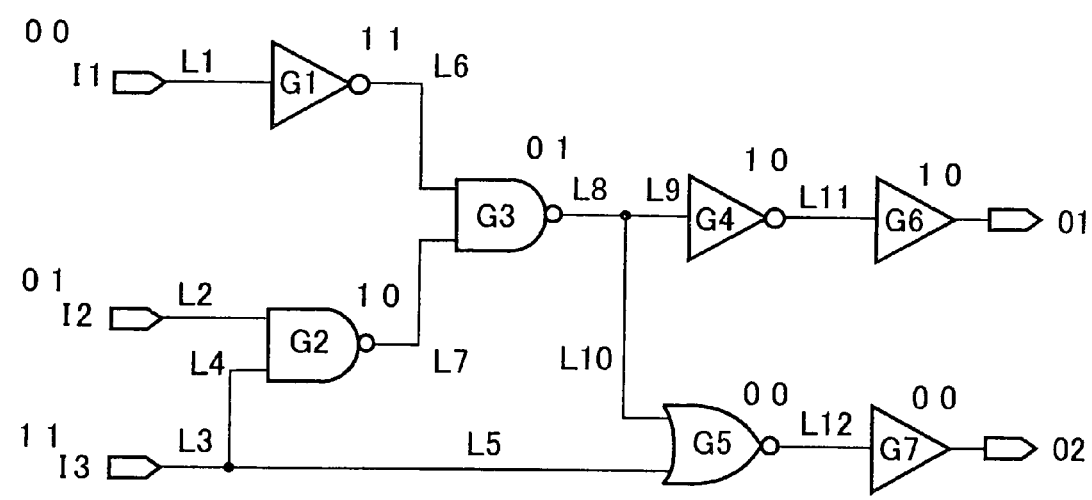
FIG. 16 is a circuit diagram depicting another example of the CMOS IC under test.

Similarly, in the logic simulation for each internal signal line in the semiconductor IC depicted in FIG. 16, the logic signal values at each input terminal, each internal signal line and each output terminal change in response to the input of each test pattern sequence as depicted in the FIG. 17 table. For example, in the case where the set signal propagation path in which a fault possibly occurs is <I3, L3, L5, L12, O2>, the FIG. 17 table shows that I3, L3, L5, L12 and O2 are R, R, R, F and F, respectively for the test pattern sequence T1; that is, the logic signal values change at every point on this signal propagation path. Further, for the test pattern sequence T2, too, I3, L3, L5, L12 and O2 are R, R, R, F and F, respectively; that is, the logic signal values change at every point on this path. Accordingly, the test pattern sequences T1 and T2 are registered in the fault list for the signal propagation path <I3, L3, L5, L12, O2>; alternatively, the path <I3, L3, L5, L12, O2> is registered for each of the test patterns T1 and T2. The signal propagation paths that are registered in the fault list are not limited specifically to the paths from the input to the output terminal of the IC under test but may also be the signal propagation paths that do not reach the output terminal, such as <I1, N1> in the semiconductor IC of FIG. 14 and <I1, L1, L6> in the IC of FIG. 16.

In the case where it is found, in step 802, that there is no test pattern sequence that causes the logic signal value sequence to change at every point on the path concerned or after the registration in the fault list in step 803, it is checked in step 804 whether there still remains a signal propagation path left unchecked in the semiconductor IC under test. If an unchecked signal propagation path is found, the procedure goes to step 805 of setting a signal propagation path that become possibly faulty, followed by a return to step 803. In this way, steps 802, 803, 804 and 805 are repeated as long as there remains such an unchecked signal propagation path that becomes possibly faulty. Upon completion of checking all the signal propagation paths that become possibly faulty, the fault list generating procedure ends. FIG. 24 is a table showing a fault list on the signal propagation paths obtained by logic simulations done as to whether the logic gates perform switching in the internal signal lines of the semiconductor IC of FIG. 14. FIG. 25 is a table showing a fault list on the signal propagation paths obtained by logic simulations done as to whether the logic signal value sequences change in the internal signal lines of the semiconductor IC of FIG. 16. As will be understood from FIGS. 15, 17, 24 and 25, the memories 102M and 103M may be formed by one memory.

Figure 26:
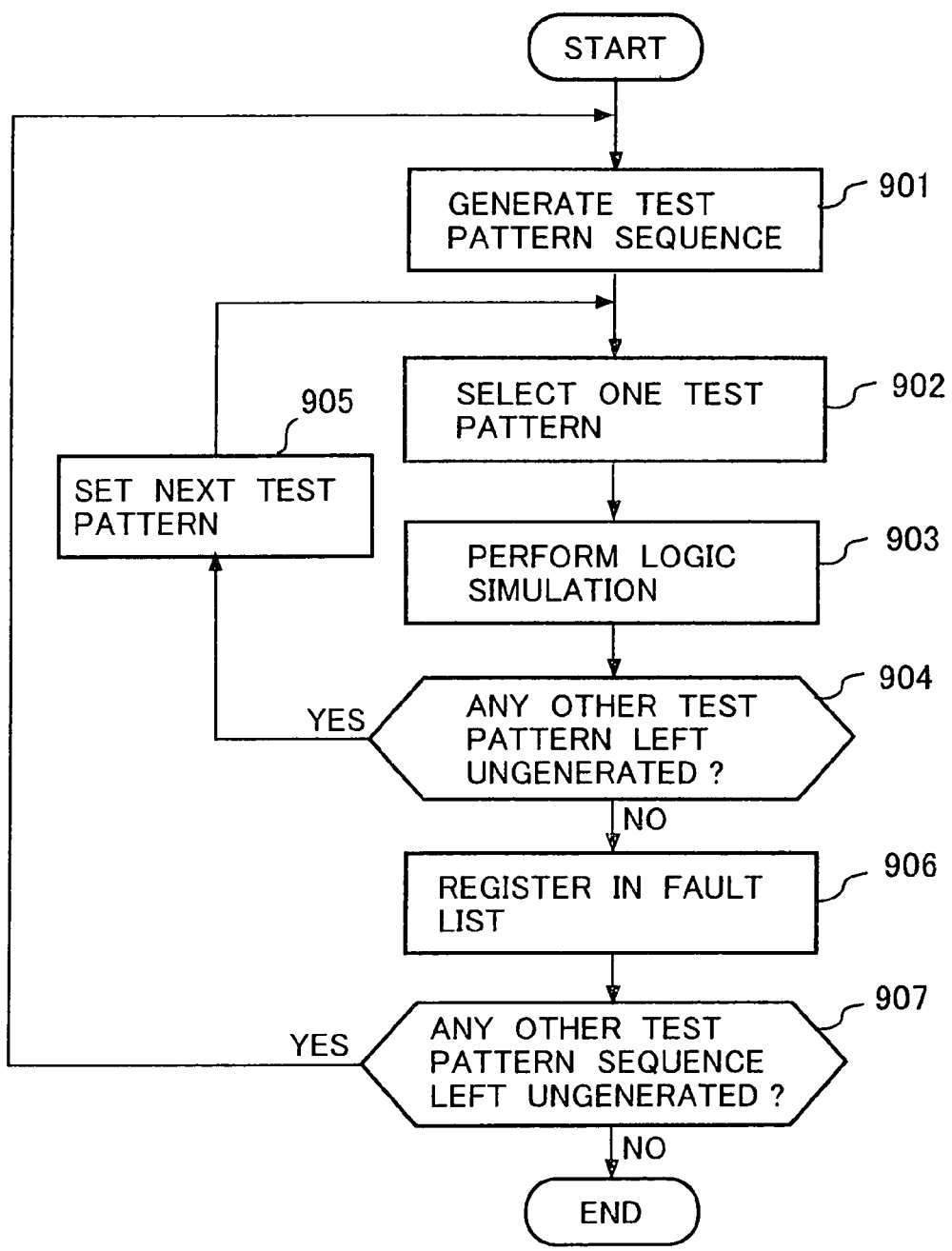
FIG. 26 is a flowchart depicting another procedure of the fault simulation method according to the present invention.

While in the above the fault list is generated after performing logic simulations using all the test pattern sequences, it is also possible to register the result of the logic simulation in the fault list upon completion of the simulation with each test pattern sequence, as required, so that the generation of the fault list ends when the logic simulations using all the test patterns are completed. An example of such a procedure is depicted in FIG. 26. For instance, when the semiconductor IC under test has three input terminals, three pseudo random pattern generators with different initial values are operated on the same clock to generate three random patterns, which are each input to a one-clock delay register. The test pattern sequences are each generated by taking out, as test patterns, the outputs from the three delay registers, then taking out, as test patterns, the outputs from the three random pattern generators, and combining the taken-out outputs.

In step 901, one of the test pattern sequences for which the fault list is desired to make is generated, for example, by combining the outputs from the delay registers and the pseudo random pattern generators as described above. Next, in step 902 one test pattern of the thus generated test pattern sequence is taken out in orderly sequence, and in step 903 a logic simulation of the operation of the semiconductor IC under test, using the taken-out test pattern, and logic signal values occurring in signal lines of the IC and stored in the memory 102M for each signal line in correspondence with the test pattern used. In step 904 it is checked whether there still remains in the test pattern sequence a test pattern left unused or unattended, and if so, the procedure goes to step 905, in which the next test pattern is set (generated), for example, by setting the outputs from the pseudo random pattern generators, and then steps 902 and 903 are repeated.

When no unattended test pattern is found in step 904, the registration in the fault list takes place based on the results of the logic simulation using the test pattern sequence concerned. This process will be described later on. Then, the procedure goes to step 907, in which it is checked whether there still remains a test pattern sequence left ungenerated, and if so, the procedure goes to step 901, in which the next test pattern sequence is generated; for example, the operation of the pseudo random pattern generators is advanced by one clock. For the newly generated test pattern sequence, steps 902 to 906 are performed again. When no ungenerated test pattern sequence is found in step 907, for example, when the pseudo random pattern generators have finished one round of generating the test pattern sequences, the procedure ends.

Figure 14:
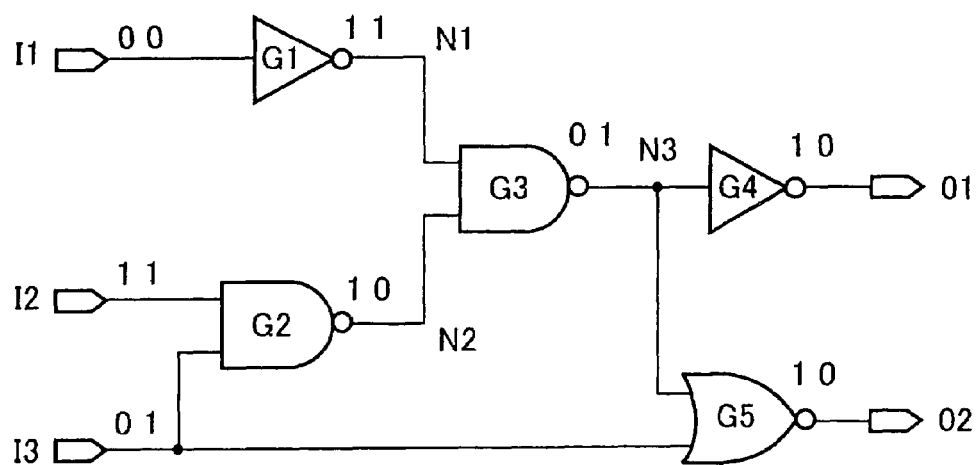
FIG. 14 is a circuit diagram depicting an example of the CMOS IC under test.

Now, a description will be given, with reference to FIG. 21, of the procedure for registration in the fault list in step 906 in FIG. 26. In step 401 one of logic gates that become possibly faulty in the semiconductor IC under test is initially set. Next, in step 402 it is checked from the stored contents 102M whether the logic signal value sequence in the output signal line of the set logic gate, calculated by the logic simulator 102 for the test pattern sequence generated in step 901 in FIG. 26, has been changed. If the logic signal value sequence has been changed in the output signal line of the set logic gate, the procedure goes to step 404, in which the logic gate and the test pattern sequence concerned are registered in the fault list. Consider, for example, the case where the circuit of FIG. 14 is under test and the test pattern sequence generated in step 901 in FIG. 26 is T9 in the FIG. 15 table. In this instance, when the logic gate G1 in the circuit of FIG. 14 is set in step 401 in FIG. 21, the logic signal value sequence in the output node N1 of the logic gate G1 is indicated by F in association with the test pattern sequence T9 in the third column of the FIG. 15 table; that is, the logic signal value sequence is indicated to have been changed by the test pattern sequence T9. Hence, G1 is registered for T9 in the fault list; alternatively, T9 is registered for G1. The fault that is detectable when the signal value in the output node of the faulty logic gate is R (a rising transition) and the fault that is detectable when the signal value in the output node is F (a falling transition) can also be registered as different faults. For instance, when the logic gate G1 is set, the two detectable faults mentioned above are registered as G1R and G1F in the fault list. In the above example, since the signal value in the output node N1 of the logic gate has the signal value F for the test pattern sequence T9, T9 is registered for G1F in the fault list, or G1F is registered for the test pattern sequence T9. If the logic signal value sequence in the output node of the set logic gate has not changed, then the procedure goes to step 404. In step 404 a check is made to see if there still remains a logic gate left unchecked, and if so, the next logic gate that becomes possibly faulty is set in step 405, followed by a return to step 402. In this way, steps 402, 403, 404 and 405 are repeated until logic gates that become possibly faulty are all checked or attended to, and when no such an uncheckd or unattented logic gate is found, the procedure ends. As described above, upon generation of each test pattern sequence, processing is performed as to whether to register the test pattern sequence and the set logic gate in the fault list.

Referring next to FIG. 22, a description will be given of the procedure for generating the fault list for each signal line in step 906 in FIG. 26. In step 501, one of the signal lines that become possibly faulty in the semiconductor IC under test is initialized. Next, in step 502 it is checked from the stored contents of the memory 102M whether the logic signal sequence in the set signal line, calculated by the logic simulator for the test pattern sequence generated in step 901 in FIG. 26, has been changed. If the logic signal value sequence has been changed in the set signal line, the procedure goes to step 503, whereas when the logic signal value sequence has not been changed, the procedure goes to step 505. Next, in step 503 it is checked whether the logic signal value sequence in the output signal line of the logic gate having its input connected to the set signal line, calculated by the logic simulator for the test pattern sequence generated in step 901 in FIG. 26, has been changed. If the logic signal value sequence in the output signal line of the logic gate has been changed, the set signal line is registered in the fault list in step 504, and the procedure goes to step 505. For example, in the case where the test pattern T1 in FIG. 17 is generated in step 901 in FIG. 26 and the signal line L3 in the semiconductor IC of FIG. 16 is set in step 501 in FIG. 22, the logic signal value sequences in the signal line L3 and in the output signal line L12 of the logic gate G5 having its input connected to the signal line L3 have changed, and consequently, the test pattern T1 is registered for the set signal line L3 in the fault list, or L3 is registered for T1. If the logic signal value sequence in the logic gate having its input connected to the set signal line has not been changed by the test pattern sequence generated at that time, the procedure goes to step 505. In step 505 a check is made to determine whether there is any other unchecked signal line that becomes possibly faulty. If such a signal line is found, the next signal line that becomes possibly faulty is set in step 506, followed by a return to step 502. In this way, steps 502, 503, 504, 505 and 506 are repeated until all the signal lines that become possibly faulty in the semiconductor IC under test are checked. When no such an unchecked signal line is found, the procedure ends. The processing described above is performed upon each generation of the test pattern in step 901.

Referring to FIG. 23, a description will be given of an example of the procedure for generating a fault list for each signal propagation path in step 906 in FIG. 26. In step 801 one or the signal propagation paths that become possibly faulty in the semiconductor IC under test is initially set. Next, in step 802 it is checked whether the logic signal value sequence at every point in the set signal propagation path, calculated by the logic simulator 102 for the test pattern sequence generated in step 901 in FIG. 26, has been changed. If so, the procedure goes to step 803, then the set signal propagation path is registered in the fault list, and the procedure goes to step 804. For example, in the case where the test pattern T9 in FIG. 15 is generated in step 901 in FIG. 26 and the signal propagation path <I1, N1, N3, O1> in the semiconductor IC of FIG. 14 is set in step 801 in FIG. 23, the logic signal value sequence changes at every point in the set signal propagation path, and consequently, the test pattern sequence T9 is registered for the set signal propagation path <I1, N1, N3, O1> in the fault list, or <I1, N1, N3, O1> is registered for T9. The signal propagation paths that are registered in the fault list are not limited specifically to the paths from the input to the output terminal of the IC under test, but signal propagation paths that do not extend to the output terminal of the input terminal, such as <I1, N1> in the semiconductor IC of FIG. 14 and <I1, L1, L6> in FIG. 16 may also be registered. If no logic signal value sequence has been changed at any point in the set signal propagation path, the procedure goes to step 804. In step 804 a check is made to see if there is still left unchecked a signal propagation path that become possibly faulty, and if so, the next signal propagation path that becomes possibly faulty is set in step 805, followed by a return to step 802. In this way, steps 802, 803, 804 and 805 are repeated until all the signal propagation paths that become possibly faulty in the semiconductor IC under test are checked. When no such an unchecked signal propagation path is found, the procedure ends. The processing described above is performed upon each generation of the test pattern in step 901.

Figure 1A:
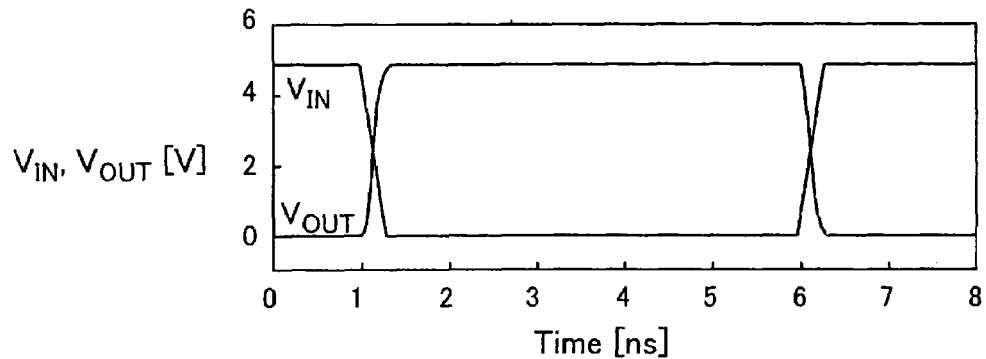
FIG. 1A is a graph showing secular changes in input and output voltages $V_{IN}$ and $V_{OUT}$ of a CMOS inverter.
Figure 1B:
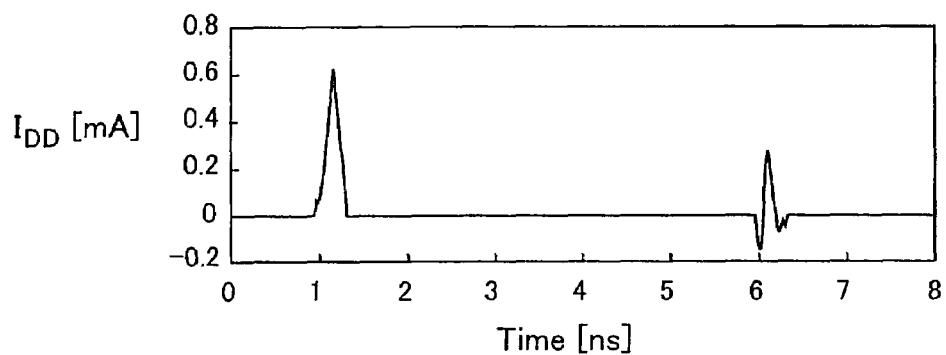
FIG. 1B is a graph showing an example of a transient response of a power supply current $I_{DD}$ to the secular changes in the input voltage in FIG. 1A.
Figure 1C:
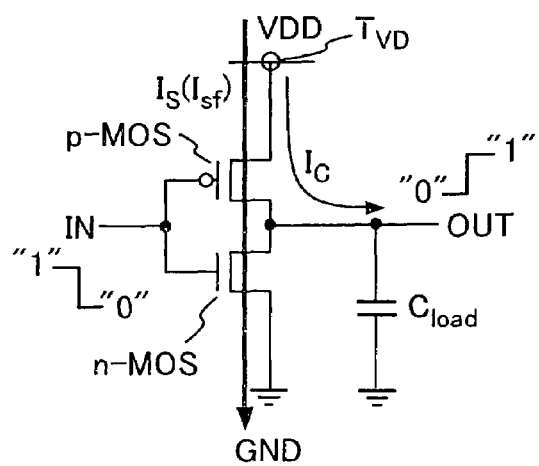
FIG. 1C is a diagram depicting the CMOS inverter and its power supply current that flows at the time of a rising transition of the inverter output.
Figure 1D:
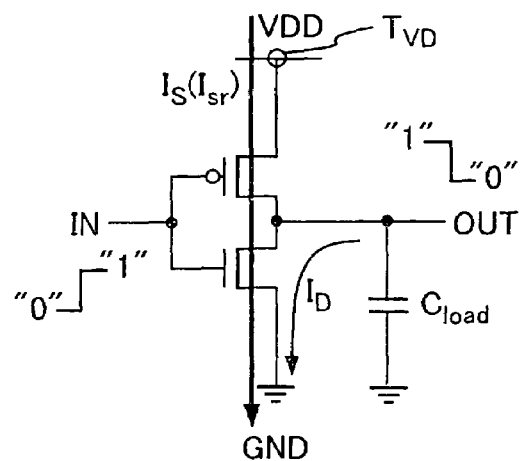
FIG. 1D is a diagram depicting the CMOS inverter and its power supply current that flows at the time of a falling transition of the inverter output.
Figure 2A:
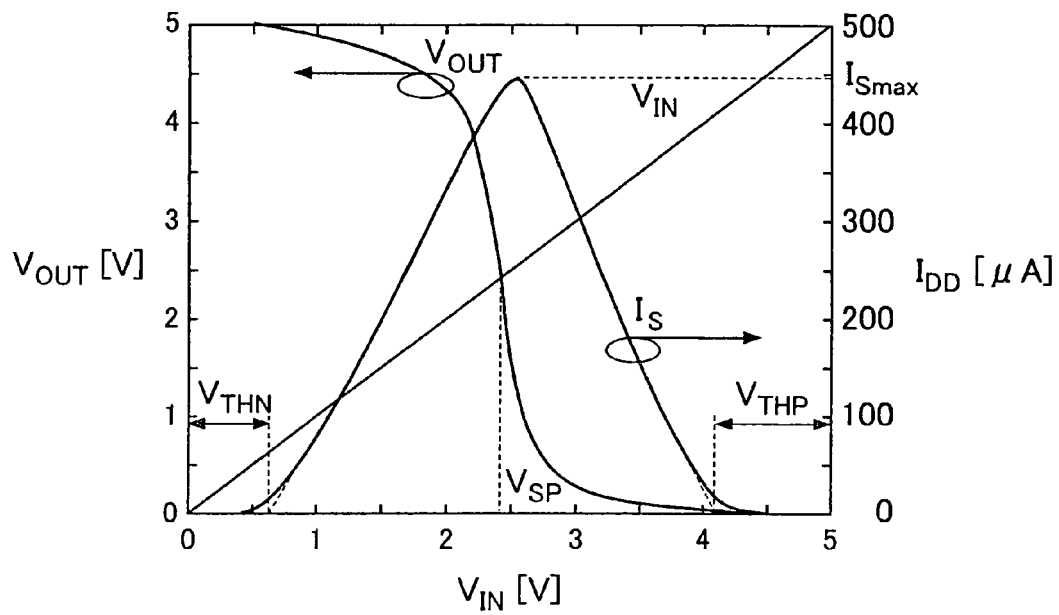
FIG. 2A is a graph showing transfer characteristics of input and output voltages $V_{IN}$ and $V_{OUT}$ and a power supply current $I_S$ in a typical example of the transient response of a CMOS logic gate.
Figure 2B:
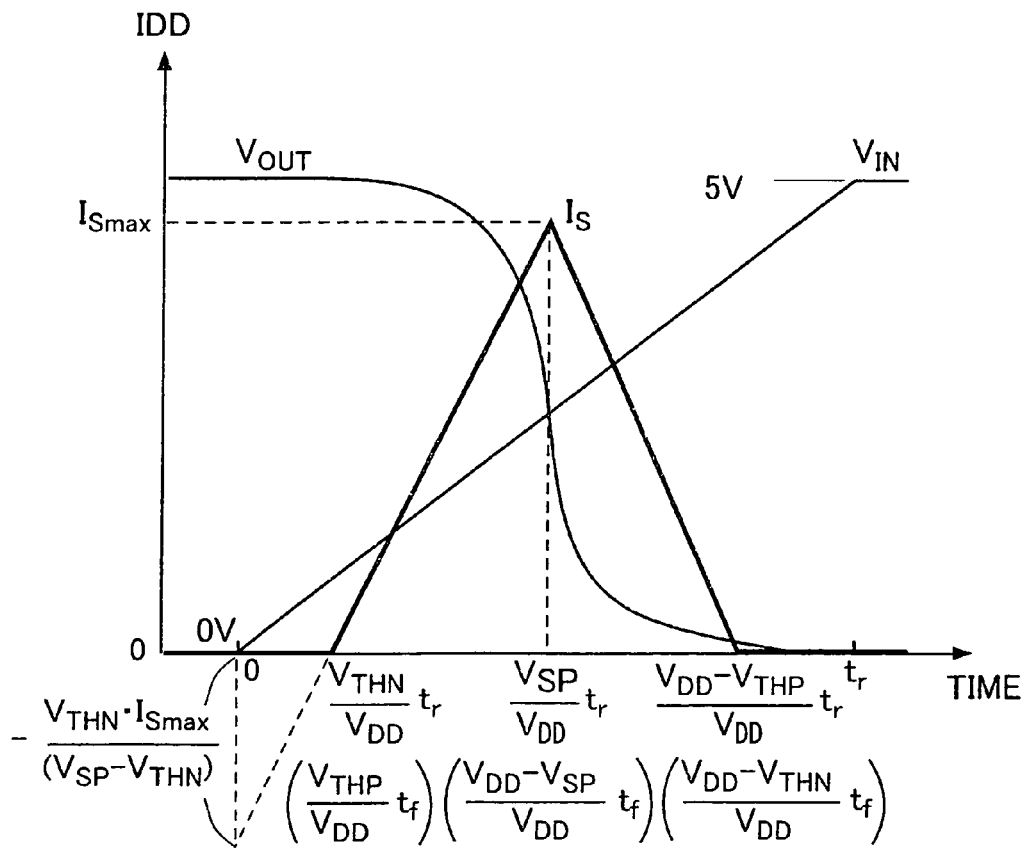
FIG. 2B is a diagram depicting an approximate waveform of the transient current in FIG. 2A.
Figure 3:
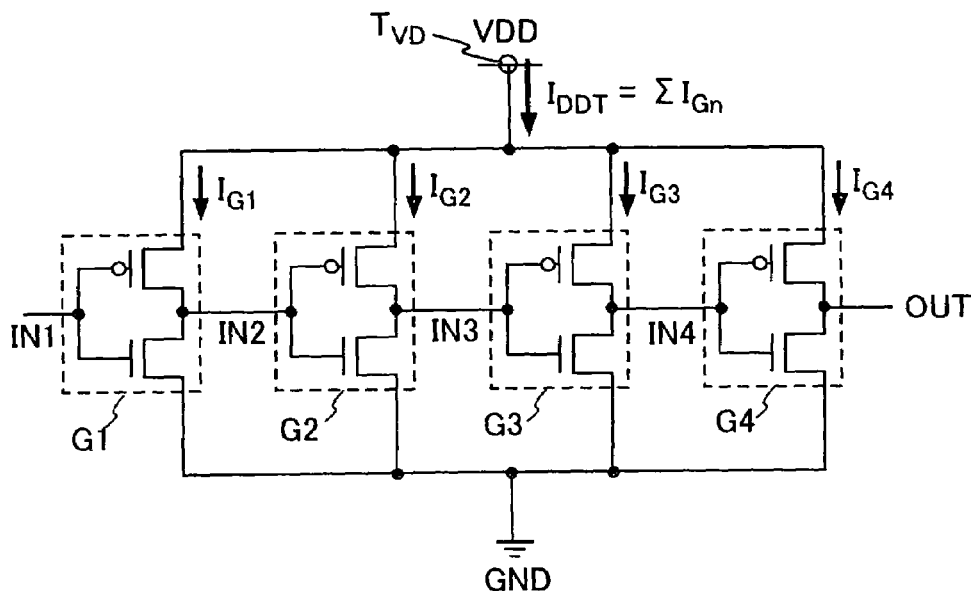
FIG. 3A is a circuit diagram depicting an example of a CMIS IC.
FIG. 3B is a graph showing variations in the input voltage to and the output voltage from the IC depicted in FIG. 3A.
FIG. 3C is a graph depicting a transient power supply current response $I_{DDT}$ observed when the input voltage of FIG. 3B is applied to the circuit of FIG. 3A.
Figure 3:
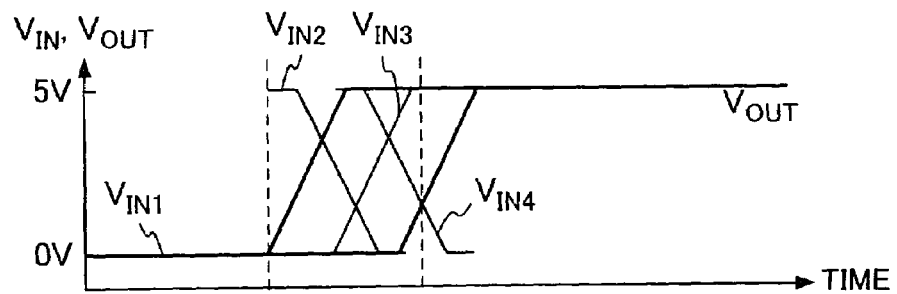
Figure 3:
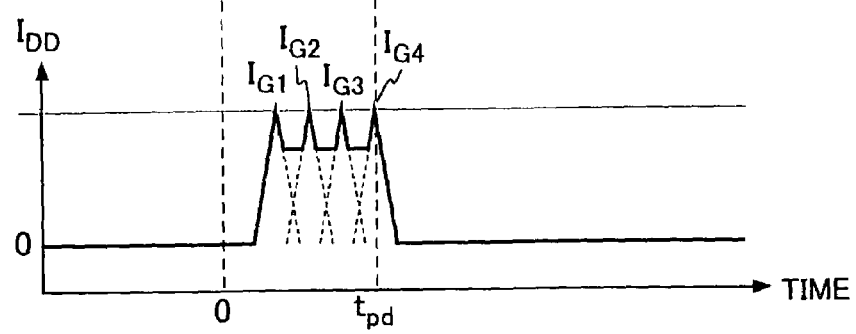
Figure 4A:
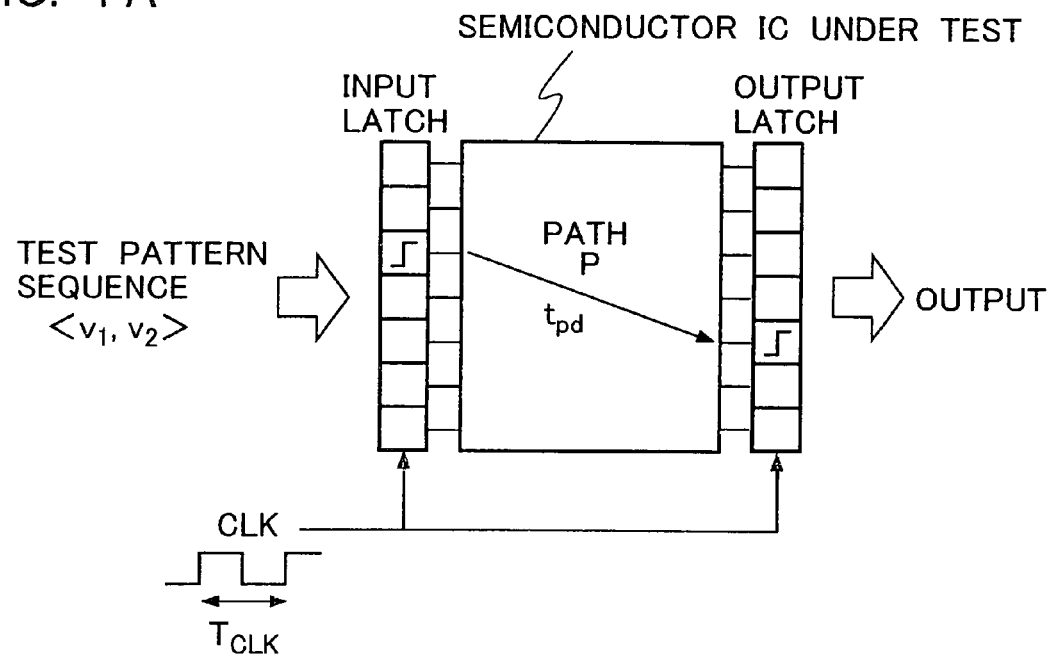
FIG. 4A is a diagram schematically showing the basic principle of a delay fault testing method for a semiconductor IC provided with input and output latches.
Figure 4B:
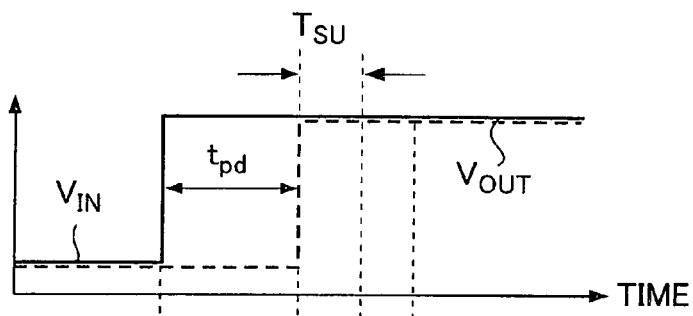
FIG. 4B is a diagram depicting a delay of the output voltage $V_{OUT}$ behind the input voltage $V_{IN}$ in the testing shown in FIG. 4A.
Figure 4C:
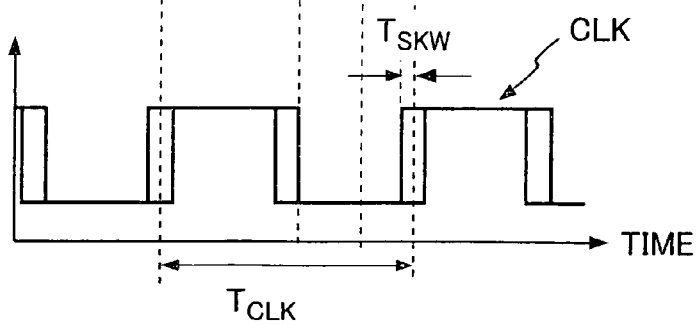
FIG. 4C is a graph depicting an operation clock for the testing of FIG. 4A in association with FIG. 4B.
Figure 5A:
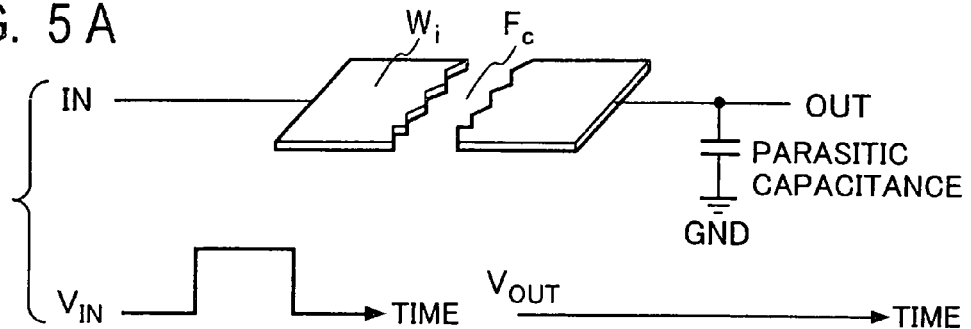
FIG. 5A is a diagram showing a open in a signal line which causes a logic fault, and input and output voltages at that time.
Figure 5B:
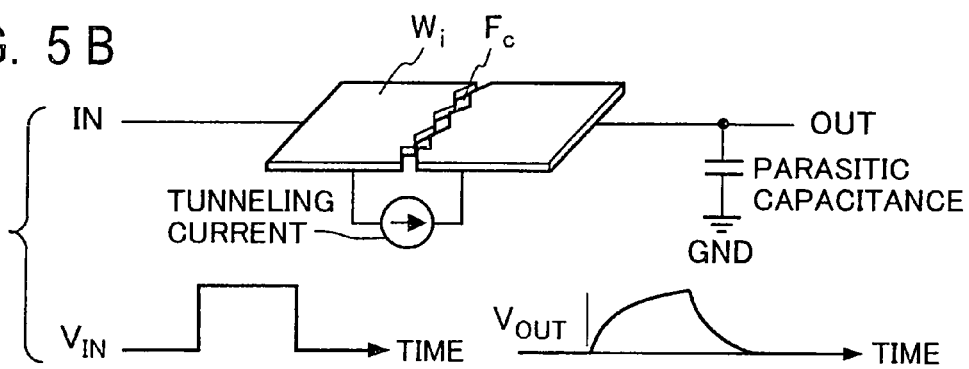
FIG. 5B is a diagram showing a open in a signal line which causes a delay fault, and input and output voltages at that time.
Figure 6A:
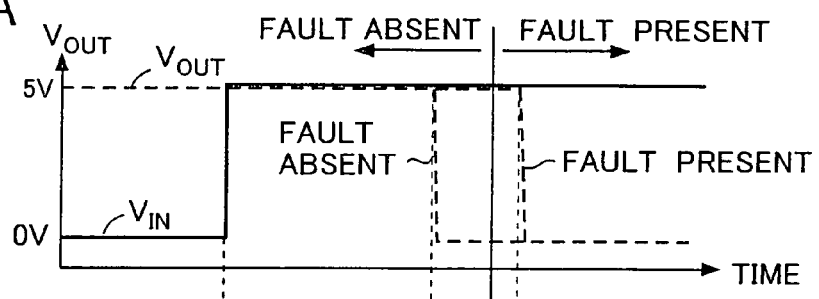
FIG. 6A is a graph depicting changes in input and output voltages with time in the cases where no delay fault is present and where a delay fault is present.
Figure 6B:
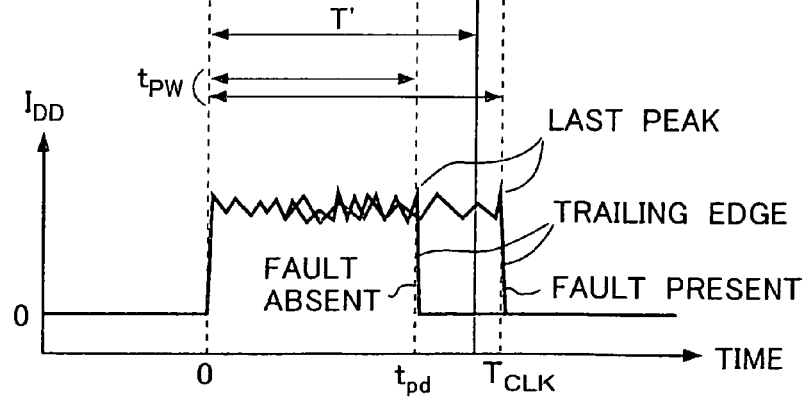
FIG. 6B is a graph depicting, in association with FIG. 6A, the transient power supply current for explaining the principle of a transient power supply current testing method.
Figure 7A:
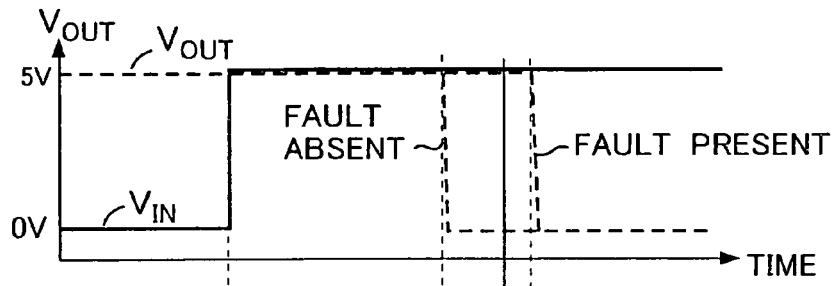
FIG. 7 is explanatory of the principle of another transient power supply current testing method, FIG. 7A being a graph showing changes in input and output voltages with time in the cases where no delay fault is present and where a delay fault is present and FIG. 7B a graph depicting the transient power supply current corresponding thereto and its measuring points.
Figure 7B:
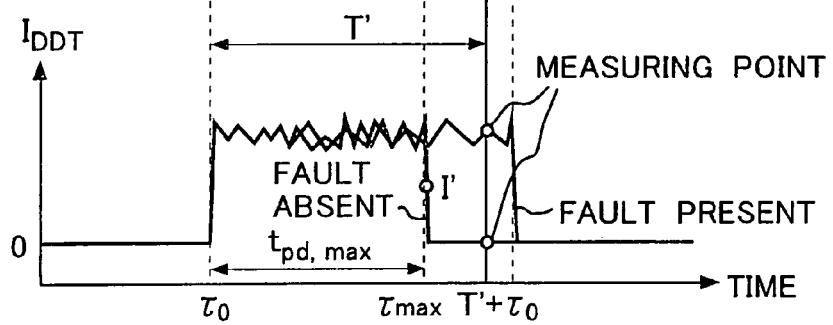
Figure 8:
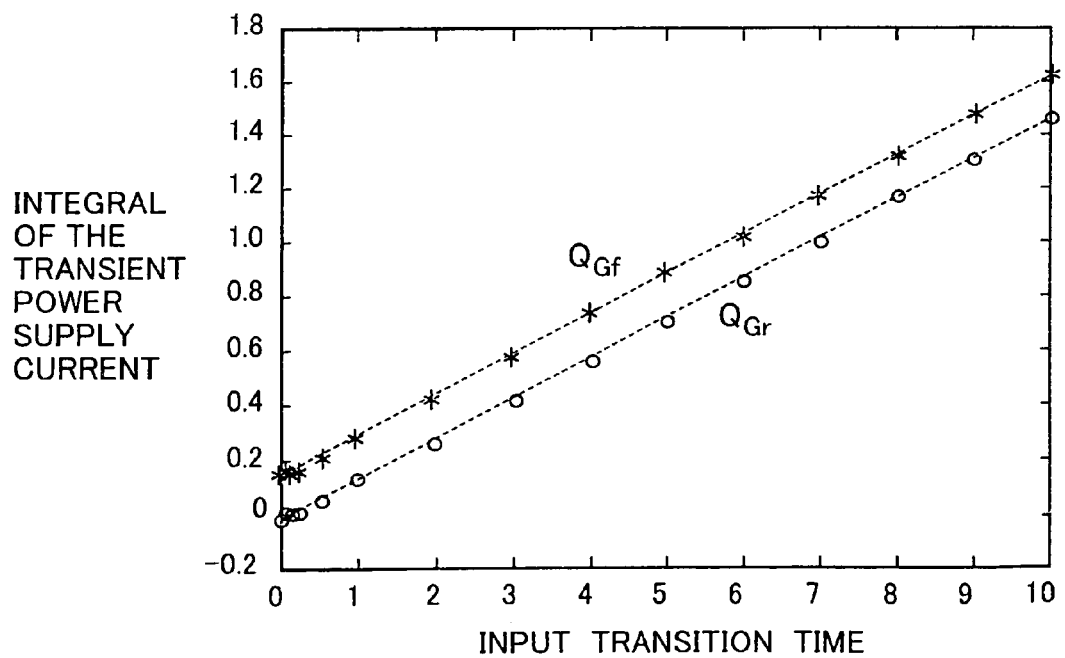
FIG. 8 is a graph showing changes in the integral of the transient power supply current with the input transition time of the CMOS inverter.
Figure 9:
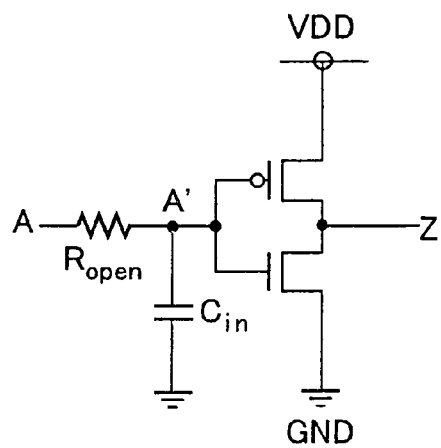
FIG. 9A is a circuit diagram depicting a model of a small open fault present in an input signal line of the CMOS inverter.
FIG. 9B is a graph schematically depicting the signal transition time in the absence of the small open fault.
FIG. 9C is a graph schematically depicting the signal transition time in the presence of the small open fault.
Figure 9:
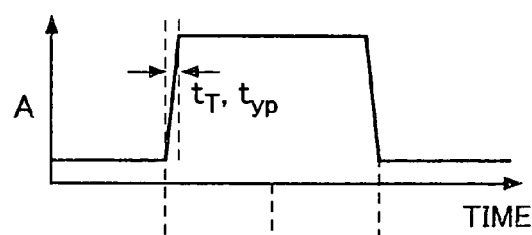
Figure 9:
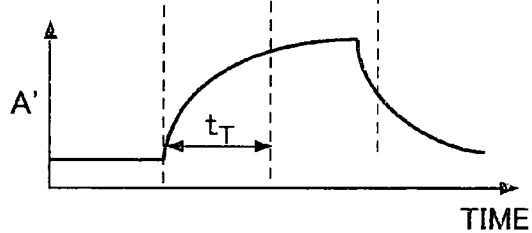
Figure 10:
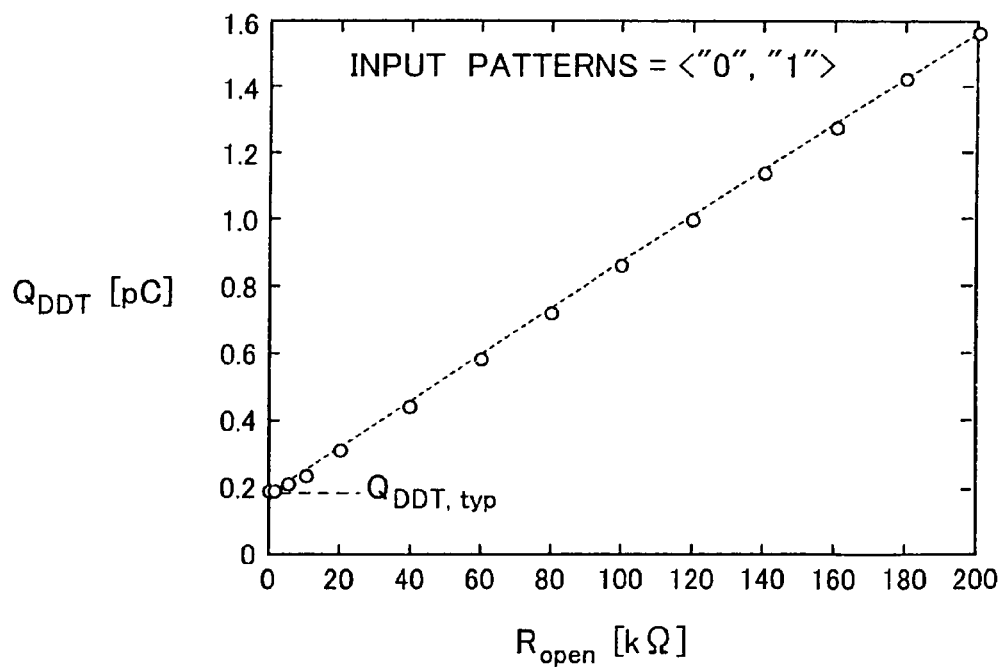
FIG. 10 is a graph showing variations in an integral $Q_{DDT}$ of the transient power supply current of a CMOS IC with respect to the resistance value $R_{open}$ of the small open fault present in the CMOS IC.
Figure 11:
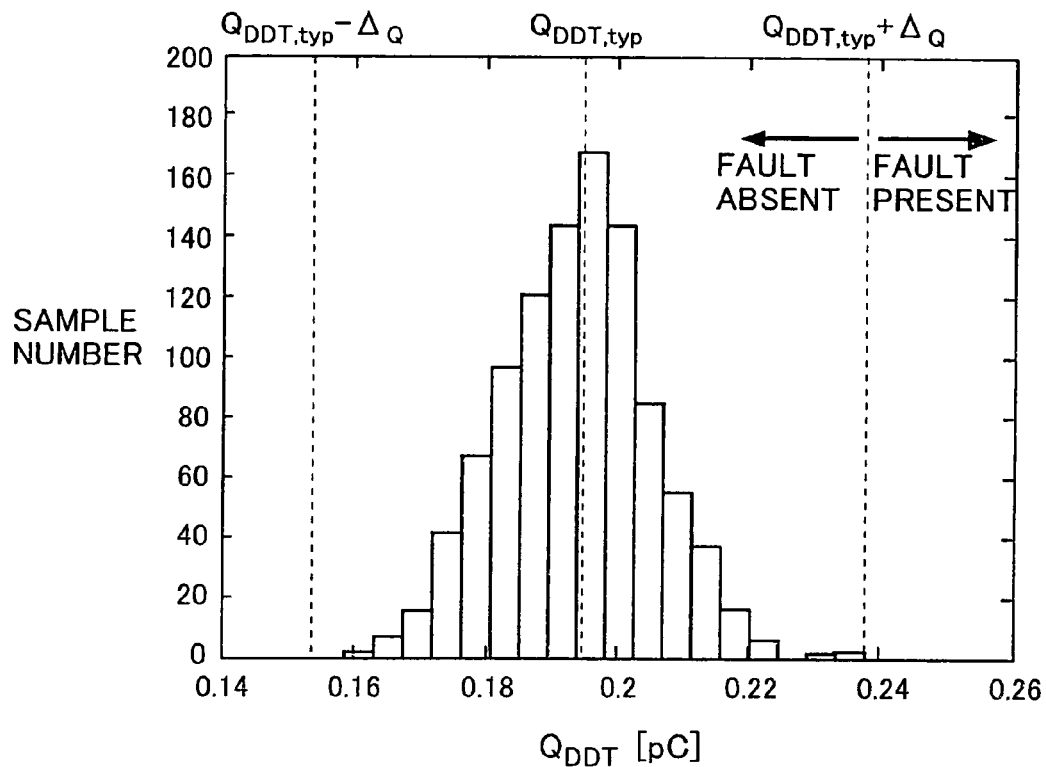
FIG. 11 is a histogram showing the distribution of integrals of the transient power supply current of the CMOS IC with respect to variations in CMOS manufacturing process.
Figure 12:
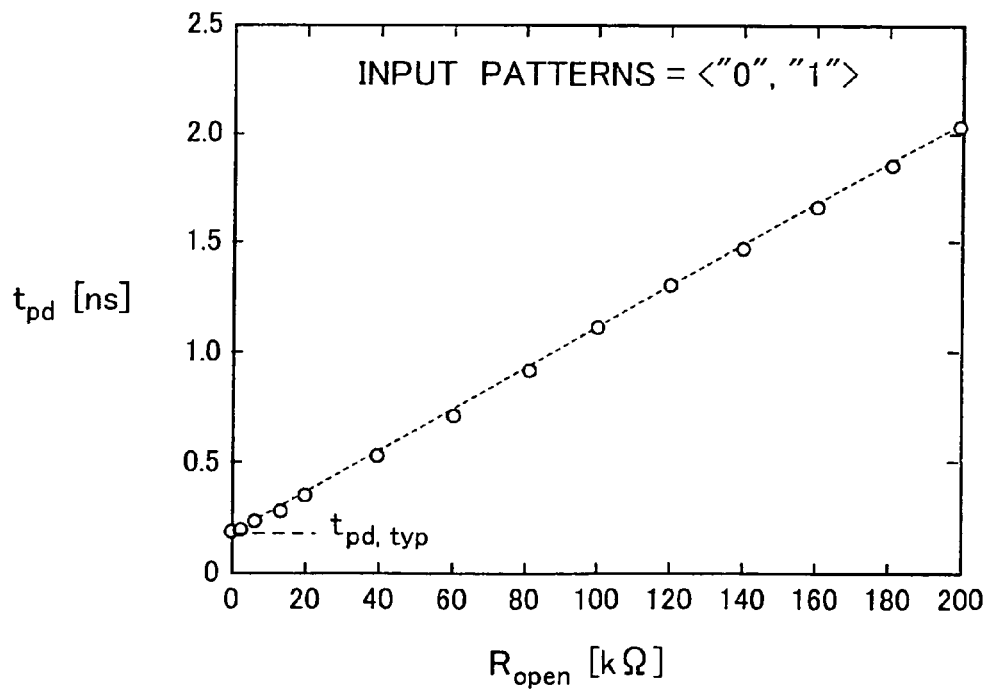
FIG. 12 is a graph showing variations in the delay time $t_{pd}$ of a path under test of the CMOS IC with respect to the resistance value $R_{open}$ of the small open fault present in the path.
Figure 13:
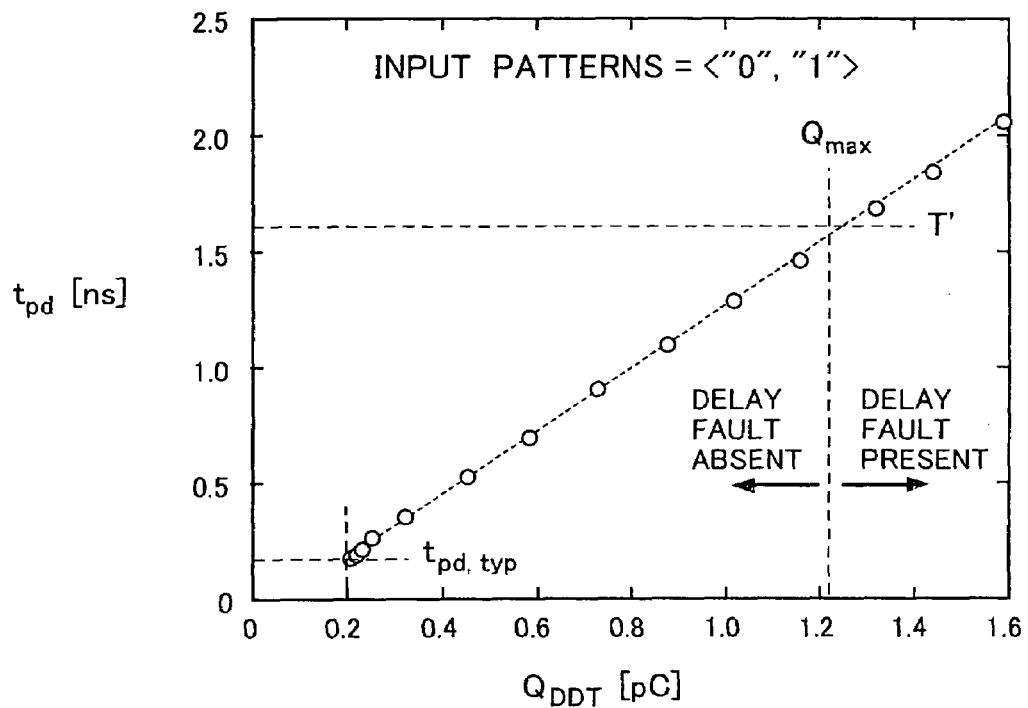
FIG. 13 is a graph depicting the linearity between the integral $Q_{DDT}$ of the transient power supply current of the CMOS IC and the delay time $t_{pd}$ Of the path under test with the presence of the small open fault assumed to line in the path.
Figure 27:
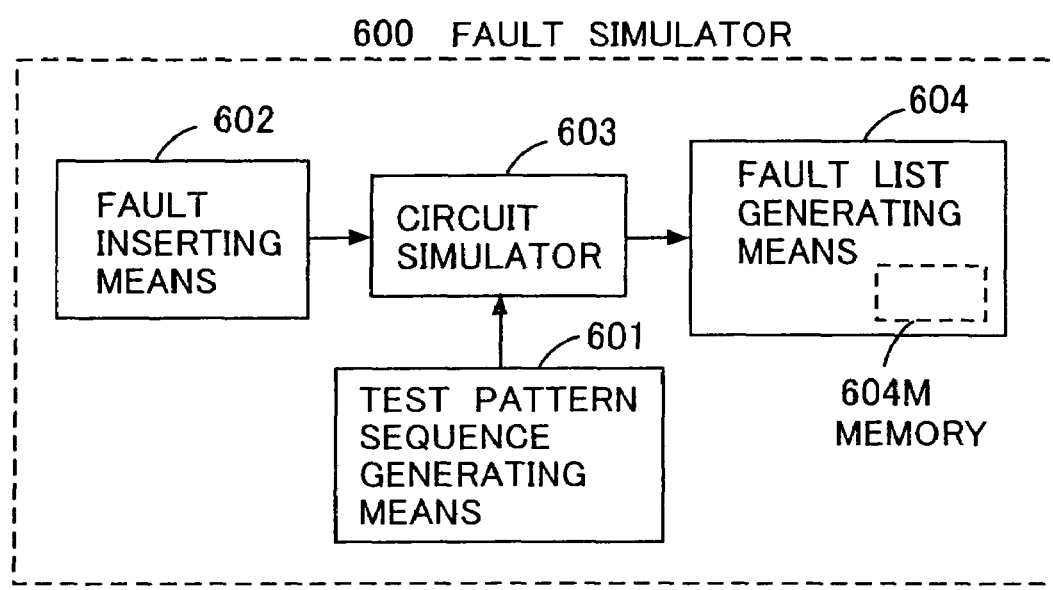
FIG. 27 is a block diagram illustrating the configuration of anther embodiment of the fault simulator according to the present invention.

FIG. 27 illustrates in block form another embodiment of the fault simulator according to the present invention. The fault simulator, indicated generally by 600, comprises test pattern sequence generating means 601, fault inserting means 602, a circuit simulator 603 and fault list generating means 604. The test pattern sequence generating means 601 generates a test pattern sequence that is composed of two or more test patterns for input to the semiconductor IC under test. The fault inserting means 602 inserts an assumed fault into the semiconductor IC-under test. The circuit simulator 603 applies the test pattern sequence, generated by the test pattern sequence generating means, to the IC under test with the assumed fault inserted therein by the fault inserting means 602 and performs a circuit simulation, thereby calculating the transient power supply current of the IC under test. The fault list generating means 604 compares the transient power supply current, calculated by the circuit simulator 603, with a transient power supply current of a normal circuit, then generates a fault list by deciding whether the fault is detectable by the transient power supply current using the test pattern sequence, and stores the fault list in the memory 604M. The test pattern sequence generating means 601, the fault inserting means 602, the circuit simulator 603 and the fault list generating means can be formed by either hardware or software. There has been proposed a software configuration of the circuit simulator. According to the conventional scheme, connection information about the semiconductor IC for each transistor, for example, in the case of the circuit of FIG. 3A, connection information about how each transistor is connected is input to the circuit simulator, by which the semiconductor IC under test is constructed on software, then a model file of the characteristic of each transistor is read out according to set conditions and the transient power supply current responding to an input pattern is calculated by simulation. An open fault can be inserted by only inserting a high-resistance element in the point where the fault is assumed to lie, and a delay fault can be inserted by only inserting a delay element in the point where the fault is assumed to lie. The circuit simulator 603 may be a general-purpose circuit simulator, for example, Star-HSPICE by Avant! Corporation.

Figure 28:
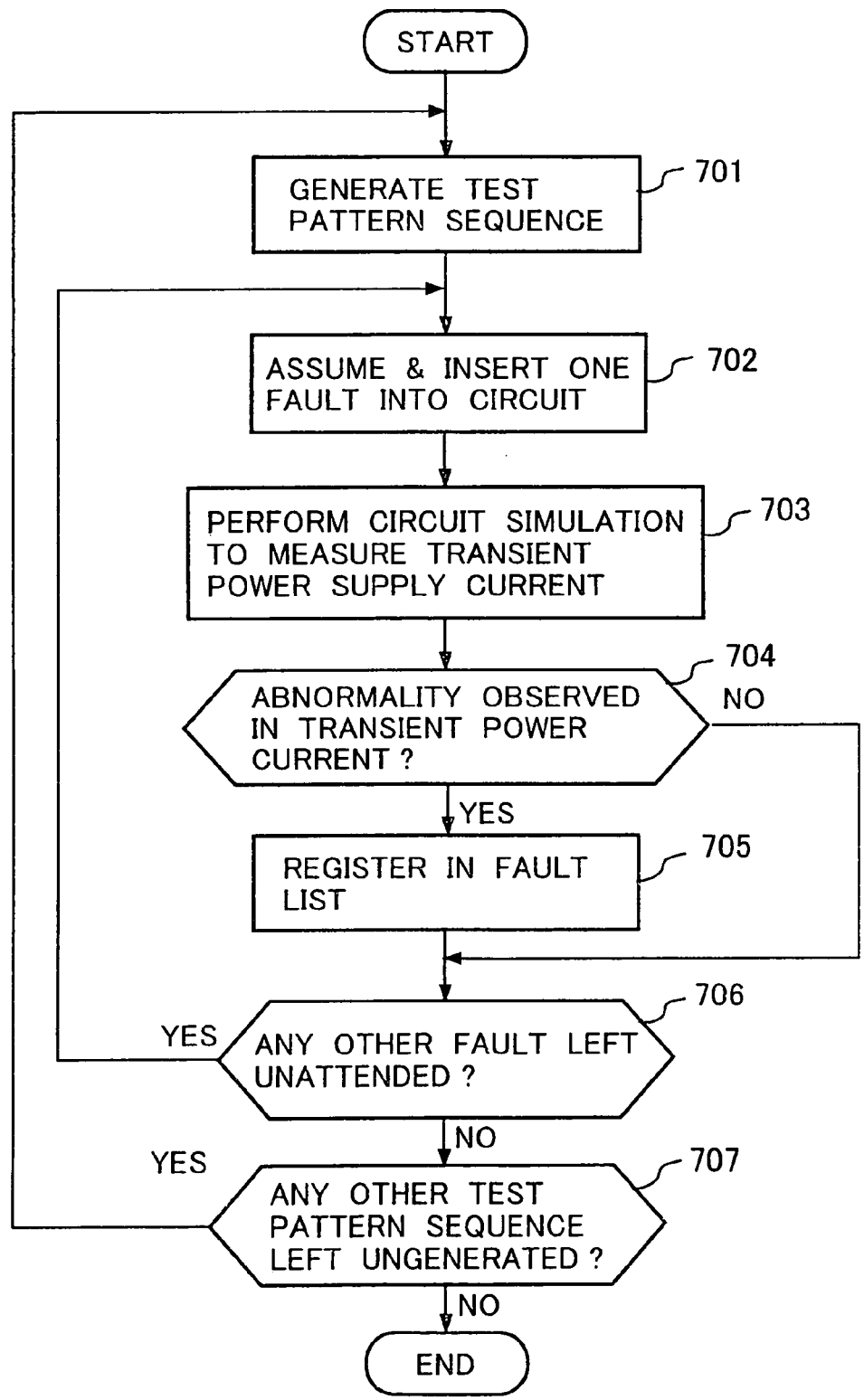
FIG. 28 is a flowchart depicting the procedure of another embodiment of the fault simulation method according to the present invention.

Next, a description will be given, with reference to FIG. 28, of a fault simulation of a semiconductor IC by the fault simulator 600 depicted in FIG. 27. FIG. 28 is a flowchart showing the procedure of another embodiment of the fault simulation method according to the present invention. In the first place, the test pattern sequence generating means 601 generates in step 701 a test pattern sequence for which a fault list is desired to make. Next, in step 702 the fault inserting means 602 assumed one of faults that possibly occur in the semiconductor IC under test, and inserts the assumed fault into the IC. Then, in step 703 the circuit simulator 603 performs circuit simulations of the operation of the faulty circuit with the fault inserted therein in step 702 and a normal, fault-free circuit in the case of applying thereto the test pattern sequence generated in step 701, and calculates the transient power supply currents of the both circuits.

In step 704, the fault list generating means 604 compares the transient power supply currents of the faulty and normal circuits calculated by the circuit simulator 603, thereby making a check to determine where an abnormality developed in the transient power supply current of the faulty circuit. If an abnormality is found, then in step 705 the fault and the test pattern sequence corresponding thereto are registered in the fault list, that is, stored in the memory 604M, and the procedure goes to step 706. If no abnormality is found in step 704, the procedure goes to step 706. Finally, in step 706 it is checked whether there still remain in the IC under test possible fault left unattended. If such faults are found, steps 702, 703, 704 and 705 are repeated until all the faults that possibly occur in the IC under test are dealt with. When such faults are not found in step 706, it is checked in step 707 whether any pattern sequences are left ungenerated. If so, the procedure returns to step 701, and the same processing as mentioned above is performed again. If no ungenerated test pattern sequence is found, the procedure ends. The comparison of the transient power supply current of the faulty circuit with the transient power supply current of the normal circuit in step 704 may be made in their waveforms as well as in their instantaneous values, pulse widths or integrals after a predetermined elapsed time as referred to previously.

Effect of the Invention

The fault simulation method and the fault simulator according to the present invention are not limited specifically to the delay and open faults but are also applicable to a logic fault (a stack fault), short fault and a parameter abnormality fault of a MOS transistor by appropriately changing the fault detecting condition by the transient power supply current testing or a fault model. Further, the present invention is applicable to the cases where transient power supply currents of not only MOS transistor ICs but also all kinds of semiconductor ICs become abnormal due to faults. While in the above the test pattern sequence has been described to be composed of two test patterns, three or more test patterns can also be used.

According to the fault simulation method according to the present invention, it is possible, with the use of the transient power supply current testing scheme of high observability and having switching information about logic gates, to generate a list of faults detectable by the transient power supply current testing for the delay fault or open fault leading to the delay fault for which no fault list could have been generated in the past. Hence, the method according to the present invention significantly improves the efficiency of testing the delay fault and open faults.

It will be apparent that many modifications and variations may be effected without departing from the scope of the novel concepts of the present invention.

What is claimed is:

1. A fault simulation method for a semiconductor IC, said method comprising the steps of:
    generating a test pattern sequence composed of two or more test patterns for input to said semiconductor IC;
    performing a logic simulation of the operation of said semiconductor IC in the case of applying thereto each or said two or more test patterns of said test pattern sequence, and calculating a logic signal value sequence in each signal line in said semiconductor IC; and
    generating a list of faults for each logic gate in said semiconductor IC, which are detectable by a transient power supply current testing using said test pattern sequence, through the use of said logic signal value sequence in said each signal line calculated by said logic simulation, wherein the list of faults is generated by checking, for said each logic gate, whether a logic signal value sequence in an output signal line of said each logic gate has been changed, and if so, generating said fault list in which an identifier of a test pattern sequence having changed said logic signal value sequence and said logic gate are registered in correspondence with each other.

2. A fault simulation method for a semiconductor IC, said method comprising the steps of:
    generating a test pattern sequence composed of two or more test patterns for input to said semiconductor IC;
    performing a logic simulation of the operation of said semiconductor IC in the case of applying thereto each of sad two or more test patterns of said test pattern sequence, and calculating a logic signal value sequence in each signal line in said semiconductor IC; and
    generating a list of faults for each signal line, which are detectable by a transient power supply current testing using said test pattern sequence, through the use of said logic signal value sequence in said each signal line calculated by said logic simulation, wherein said list of faults is generated by:
        checking, for said each signal line, whether said logic signal value sequence in said each signal line has been changed; and
        if so, checking whether a logic signal value sequence in an output signal line of a logic gate having its input connected to said signal line, in which said logic signal value sequence has been changed, is changed by a test pattern sequence having changed said logic signal value sequence in said signal line, and if so, generating said fault list in which said signal line and an identifier of said test pattern sequence having changed said logic signal value sequence in said signal line are registered in correspondence with each other.

3. A fault simulation method for a semiconductor IC, said method comprising the steps of:
    generating a test pattern sequence composed of two or more test patterns for input to said semiconductor IC;
    performing a logic simulation of the operation of said semiconductor IC in the case of applying thereto each of said two or more test patterns of said test pattern sequence, and calculating a logic signal value sequence in each signal line in said semiconductor IC; and
    generating a list of faults for each signal propagation path in said semiconductor IC, which are detectable by a transient power supply current testing using said test pattern sequence, through the use of said logic signal value sequence in said each signal line calculated by said logic simulation, wherein said list of faults is generated by checking, for said each signal propagation path, whether said signal value sequences at respective points in said each signal propagation path have all been changed, and if so, generating said fault list in which an identifier of a test pattern sequence having changed said logic signal value sequences and said each signal propagation path are registered in correspondence with each other.

4. The method of claim 1, further comprising the step of calculating said logic signal value sequence for every test pattern sequence prior to said fault list generating step.

5. The method of claim 1, further comprising the step of calculating said logic signal value sequence and generating said fault list upon generation of each test pattern sequence.

6. The method of claim 2, further comprising the step of calculating said logic signal value sequence for every test pattern sequence prior to said fault list generating step.

7. The method of claim 2, further comprising the step of calculating said logic signal value sequence and generating said fault list upon generation of each test pattern sequence.

8. The method of claim 3, further comprising the step of calculating said logic signal sequence for every test pattern sequence prior to said fault list generating step.

9. The method of claim 3, further comprising the step of calculating said logic signal value sequence and generating said fault list upon generation of each test pattern sequence.

* * * * *